United States Patent
Hatani et al.

(10) Patent No.: US 11,680,991 B2
(45) Date of Patent: Jun. 20, 2023

(54) VOLTAGE MEASUREMENT DEVICE, VOLTAGE DETECTION CIRCUIT, AND VOLTAGE DETECTION METHOD

(71) Applicant: PANASONIC SEMICONDUCTOR SOLUTIONS CO., LTD., Kyoto (JP)

(72) Inventors: Naohisa Hatani, Kyoto (JP); Jiro Miyake, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 158 days.

(21) Appl. No.: 16/998,311

(22) Filed: Aug. 20, 2020

(65) Prior Publication Data

US 2020/0379052 A1 Dec. 3, 2020

Related U.S. Application Data

(63) Continuation of application No. PCT/JP2019/006585, filed on Feb. 21, 2019.

(30) Foreign Application Priority Data

Feb. 23, 2018 (JP) .............................. JP2018-030767

(51) Int. Cl.
  *G01R 31/396* (2019.01)
  *B60L 58/20* (2019.01)
  (Continued)

(52) U.S. Cl.
  CPC ......... *G01R 31/396* (2019.01); *G01R 31/371* (2019.01); *G01R 31/3835* (2019.01);
  (Continued)

(58) Field of Classification Search
  CPC .............. G01R 31/396; G01R 31/3835; G01R 31/371; H01M 10/482; H01M 2010/4271; B60L 58/20
  (Continued)

(56) References Cited

U.S. PATENT DOCUMENTS

2007/0182377 A1   8/2007  Vandensande
2011/0004427 A1   1/2011  Gorbold et al.
(Continued)

FOREIGN PATENT DOCUMENTS

EP   2 433 150 A1   3/2012

OTHER PUBLICATIONS

Extended Search Report issued in European Patent Application No. 19757975.8, dated Feb. 26, 2021.
International Search Report and Written Opinion dated May 14, 2019 in International Patent Application No. PCT/JP2019/006585; with partial English translation.

*Primary Examiner* — Lee E Rodak
*Assistant Examiner* — Trung Q Nguyen
(74) *Attorney, Agent, or Firm* — McDermott Will & Emery LLP

(57) ABSTRACT

A voltage measurement device is a voltage measurement device including a plurality of voltage detection circuits which measure cell voltages of a plurality of cells connected in series. Each of the plurality of voltage detection circuits includes: a communication end information holding circuit which holds communication end information specifying, as at least one communication end position, at least one of the plurality of voltage detection circuits; and a communication control circuit which controls transfer for sending a communication command received from a preceding voltage detection circuit located at a preceding stage to a next voltage detection circuit located at a next stage, according to the communication end information.

17 Claims, 21 Drawing Sheets

(51) Int. Cl.
  *H01M 10/42*  (2006.01)
  *G01R 31/3835*  (2019.01)
  *G01R 31/371*  (2019.01)
  *H01M 10/48*  (2006.01)

(52) U.S. Cl.
  CPC ........... *H01M 10/482* (2013.01); *B60L 58/20* (2019.02); *H01M 10/48* (2013.01); *H01M 2010/4271* (2013.01)

(58) Field of Classification Search
  USPC ................................. 324/425–434, 415–437
  See application file for complete search history.

(56) References Cited

U.S. PATENT DOCUMENTS

| | | | |
|---|---|---|---|
| 2013/0088237 A1* | 4/2013 | Kamata | G01R 31/396 324/434 |
| 2013/0162259 A1 | 6/2013 | Wynne | |
| 2013/0264881 A1 | 10/2013 | Roeper et al. | |
| 2015/0293178 A1* | 10/2015 | Fujii | H01M 10/482 324/434 |
| 2017/0205467 A1 | 7/2017 | Kiuchi | |
| 2017/0346308 A1 | 11/2017 | Kain et al. | |

* cited by examiner

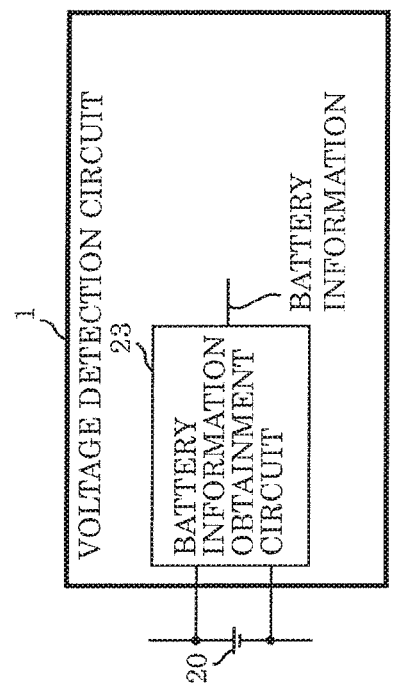

VOLTAGE MEASUREMENT DEVICE, VOLTAGE DETECTION CIRCUIT, AND VOLTAGE DETECTION METHOD

CROSS REFERENCE TO RELATED APPLICATIONS

This application is a U.S. continuation application of PCT International Patent Application Number PCT/JP2019/006585 filed on Feb. 21, 2019, claiming the benefit of priority of Japanese Patent Application Number 2018-030767 filed on Feb. 23, 2018, the entire contents of which are hereby incorporated by reference.

BACKGROUND

1. Technical Field

The present disclosure relates to a voltage measurement device, a voltage measurement circuit, and a voltage detection method.

2. Description of the Related Art

FIG. 13 is a voltage measurement device according to a first conventional technique. In the voltage measurement device, a master node connected to a controller (MCU) and slave nodes which are voltage detection circuits are connected in a ring-shaped daisy chain.

In addition, FIG. 14 illustrates communication operations in a network according to a second conventional technique. In the network, a command from a master is transferred to the master after passing through an initial node to a last node of slaves, and a reply from a specified slave is transferred to the master after passing through the last node.

CITATION LIST

Patent Literature

PTL 1: U.S. Patent Application Publication No. 2017/0346308, Specification

The first conventional technique has a problem that an electrical abnormality such as excessive current occurs when a command and a reply reach a failure part in a ring-shaped network.

The second conventional art has a problem that an electrical abnormality such as excessive current occurs when a command and a reply reach a failure part in a ring-shaped network.

SUMMARY

The present disclosure has an object to provide a voltage measurement device, a voltage detection circuit, and a voltage detection method which reduce electrical abnormality such as excessive current due to a command and a reply even in a network including a failure part.

A voltage measurement device according to an aspect of the present disclosure is a voltage measurement device including a plurality of voltage detection circuits which measure cell voltages of a plurality of cells connected in series. Each of the plurality of voltage detection circuits includes: a communication end information holding circuit which holds communication end information specifying, as at least one communication end position, at least one of the plurality of voltage detection circuits; and a communication control circuit which controls transfer for sending a communication command received from a preceding voltage detection circuit located at a preceding stage to a next voltage detection circuit located at a next stage, according to the communication end information.

A voltage detection circuit according to an aspect of the present disclosure is a voltage detection circuit included in a plurality of voltage detection circuits included in a voltage measurement device which measures cell voltages of a plurality of cells connected in series. The voltage detection circuit includes: a communication end information holding circuit which holds communication end information specifying, as at least one communication end position, at least one of the plurality of voltage detection circuits; and a communication control circuit which controls transfer for sending a communication command received from a preceding voltage detection circuit located at a preceding stage to a next voltage detection circuit located at a next stage, according to the communication end information.

A voltage measurement method according to an aspect of the present disclosure is a voltage detection method performed in a plurality of voltage detection circuits included in a voltage measurement device which measures cell voltages of a plurality of cells connected in series. Each of the plurality of voltage detection circuits controls transfer for sending a communication command received from a preceding voltage detection circuit located at a preceding stage to a next voltage detection circuit located at a next stage, according to communication end information specifying, as at least one communication end position, at least one of the plurality of voltage detection circuits.

An aspect of the present disclosure is a voltage measurement device including: a plurality of voltage detection circuits which measure cell voltages of a battery pack configured to include a plurality of cells connected in series; a controller; a first communication circuit; and a second communication circuit. The plurality of voltage detection circuits are connected in a daisy chain. Each of the plurality of voltage detection circuits includes the following circuits: a reply output circuit which outputs a reply to either an upper reply request signal or a lower reply request signal; a lower communication transfer circuit which transfers a communication command from a lower side; an upper communication control circuit which reads a communication command from an upper side, and outputs the upper reply request signal; a lower communication end information holding circuit which holds lower communication end information; an upper selection circuit which selects the reply according to the upper reply request signal, selects the communication command to be transferred by the lower communication transfer circuit according to the lower communication end information, and outputs the communication command to the upper side; an upper communication transfer circuit which transfers the communication command from the upper side; a lower communication control circuit which reads the communication command from the lower side and outputs the lower reply request signal; an upper communication end information holding circuit which holds upper communication end information; and a lower selection circuit which selects the reply according to the lower reply request signal, selects the communication command to be transferred by the upper communication transfer circuit according to the upper communication end information, and outputs the communication command to the lower side. The controller is connected to the lower side of a lowermost voltage detection circuit via the first communication circuit, is connected to the upper side of an uppermost voltage detection circuit via the second communication circuit, sends the communication commands, and receives the replies.

An aspect of the present disclosure is a voltage detection circuit for use in the voltage measurement device.

An aspect of the present disclosure is a battery pack system including a battery pack configured to include the voltage measurement device and a plurality of cells connected in series.

An aspect of the present disclosure is a voltage measurement method in a voltage measurement device including: a plurality of voltage detection circuits which measure cell voltages of a battery pack configured to include a plurality of cells connected in series; a controller; a first communication circuit; and a second communication circuit. The plurality of voltage detection circuits are connected in a daisy chain. The controller is connected to a lowermost voltage detection circuit at a lowermost stage via the first communication circuit, is connected to an uppermost voltage detection circuit at an uppermost stage via the second communication circuit, and sends the communication commands. The voltage detection circuit described above includes: an upper communication end information holding circuit which holds upper communication end information; and a lower communication end information holding circuit which holds lower communication end information. The voltage measurement method includes: a step in which the controller sends a communication command to the lowermost voltage detection circuit located at the lowermost stage via the first communication circuit; a step in which the lowermost voltage detection circuit transfers the received communication command to the voltage detection circuit specified by the lower communication end information; a step in which the voltage detection circuit which is the target of the communication command received by the lowermost voltage detection circuit sends the reply to the lower side; a step in which the controller receives the reply sent to the lower side via the first communication circuit; a step in which the controller sends the communication command to the uppermost voltage detection circuit located at the uppermost stage via the second communication circuit; a step in which the uppermost voltage detection circuit transfers the received communication command to the voltage detection circuit specified by the upper communication end information; a step in which the voltage detection circuit which is the target of the communication command received by the uppermost voltage detection circuit sends the reply to the upper side; and a step in which the controller receives the reply sent to the upper side via the second communication circuit.

According to the present disclosure, it is possible to reduce electrical abnormality such as excessive current due to a command or a reply even in a network including a failure part.

For example, according to the present disclosure, in the battery pack system configured to include the plurality of cells connected in series, it is possible to perform parallel communication from both ends of the daisy chain by means of the voltage detection circuit connected in the daisy chain preventing a communication command from being transferred over a voltage detection circuit specified in advance.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 2F is a diagram illustrating another variation of the voltage detection circuit according to Embodiment 1.

DETAILED DESCRIPTION OF THE EMBODIMENTS

Embodiment 1

Figure 1A:
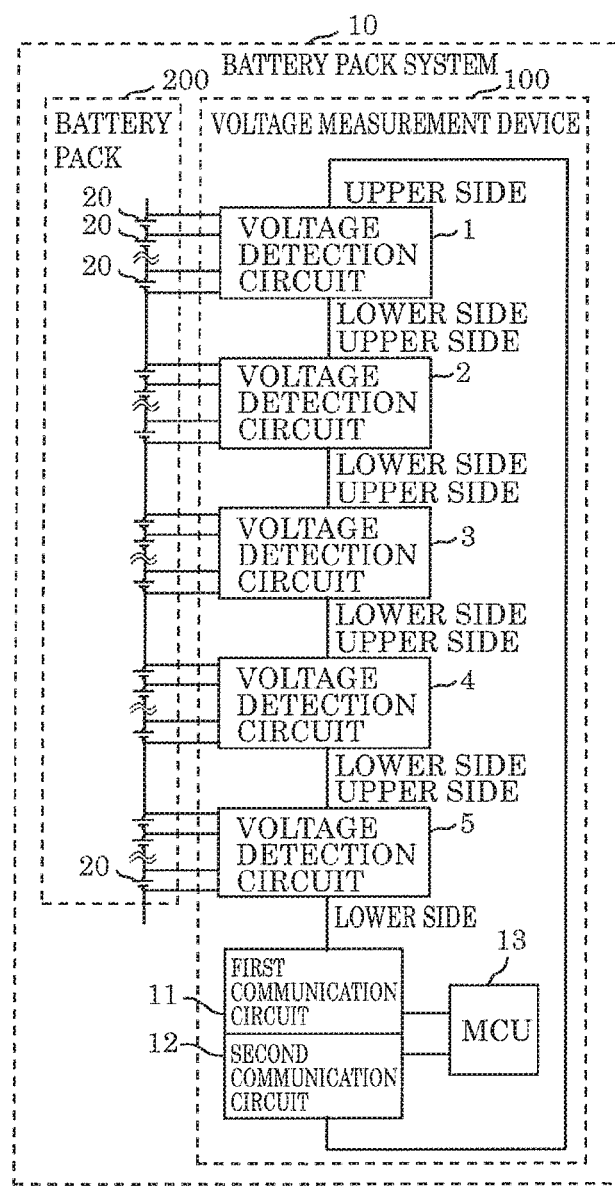
FIG. 1A is a diagram illustrating a configuration example of a battery pack system which includes a voltage measurement device including voltage detection circuits according to Embodiment 1.

As illustrated in FIG. 1A to FIG. 6, voltage measurement device 100 according to Embodiment 1 is included in voltage measurement device 10 included in battery pack system 10 and is for use in a voltage measurement method. Voltage measurement device 100 includes: a plurality of voltage detection circuits which measure cell voltages in battery pack system 200 configured to include a plurality of cells 20 connected in series; controller 13; first communication circuit 11; and second communication circuit 12. The plurality of voltage detection circuits are connected in a daisy chain. The voltage detection circuit includes the following circuits: reply output circuit 22 which outputs a reply to either an upper reply request signal or a lower reply request signal; lower communication transfer circuit 74 which transfers a communication command from a lower side; upper communication control circuit 52 which reads a communication command from an upper side, and outputs the upper reply request signal; a lower communication end information holding circuit 71 which holds lower communication end information; upper selection circuit 53 which selects the reply according to the upper reply request signal, selects the communication command to be transferred by the lower communication transfer circuit according to the lower communication end information, and outputs the communication command to the upper side; upper communication transfer circuit 54 which transfers the communication command from the upper side; lower communication control circuit 72 which reads the communication command from the lower side and outputs the lower reply request signal; an upper communication end information holding circuit 51 which holds upper communication end information; and lower selection circuit 73 which selects the reply according to the lower reply request signal, selects the communication command to be transferred by the upper communication transfer circuit according to the upper communication end information, and outputs the communication command to the lower side. Controller 13 is connected to the lower side of a lowermost voltage detection circuit via first communication circuit 11, is connected to the upper side of an uppermost voltage detection circuit via second communication circuit 12, sends the communication commands, and receives the replies.

In addition, upper selection circuit 53 selects the communication command to be transferred by lower communication transfer circuit 74 described above, according to the upper communication end information instead of the lower communication end information described above, and outputs the communication command to the upper side. Lower selection circuit 73 selects the communication command to be transferred by upper communication transfer circuit 54 described above, according to the lower communication end information instead of the upper communication end information described above, and outputs the communication command to the lower side.

In addition, the reply described above is battery information of cells 20 connected to the voltage detection circuit described above.

Furthermore, details are described with reference to the drawings.

FIG. 1A illustrates voltage measurement device 100 according to Embodiment 1, and illustrates, in particular, communication commands and replies in the case where a failure is present in a communication path between voltage detection circuit 2 and voltage detection circuit 3. In addition, device addresses 1 to 5 are respectively set to device address holding circuits 21 of voltage detection circuits 1 to 5.

Figure 2A:
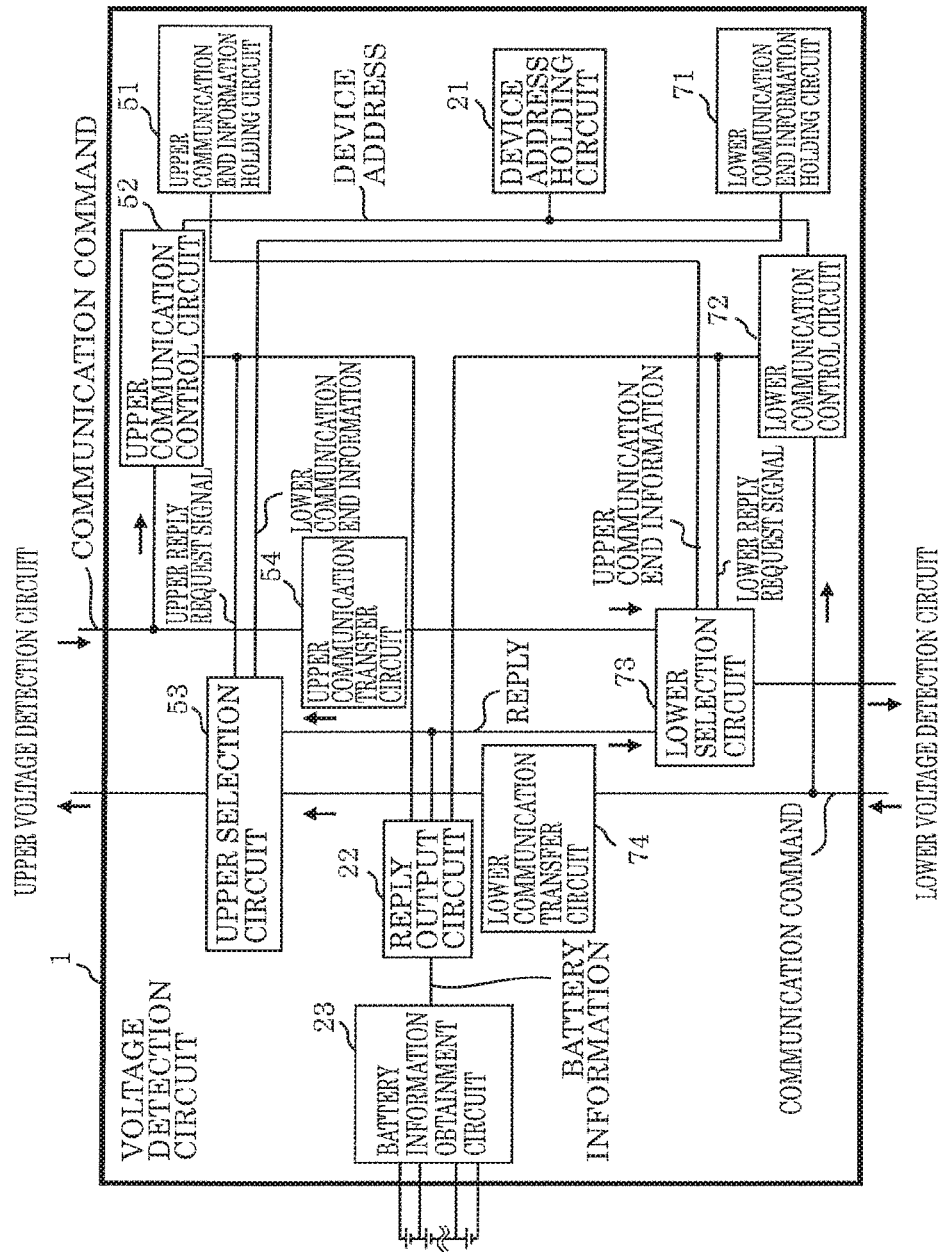
FIG. 2A is a diagram illustrating a configuration example of the voltage detection circuit according to Embodiment 1.

FIG. 2A is a detailed diagram illustrating one of the voltage detection circuits according to Embodiment 1.

As illustrated in FIG. 2A, 3 is set to lower communication end information indicating a final application destination of a communication command from the lower side, and 2 is set to upper communication end information indicating a final application destination of a communication command from the upper side.

In addition, when an MCU sends a communication command for reading battery information from voltage detection circuit 4 to the lower side of voltage detection circuit 5 via first communication circuit 11, voltage detection circuit 5 and voltage detection circuit 4 which are not specified by the lower communication end information transfer the communication command respectively to the upper side of voltage detection circuit 5 and the upper side of voltage detection circuit 4, via lower communication transfer circuit 74 and upper selection circuit 53. Voltage detection circuit 3 is specified by the lower communication end information, and thus does not transfer the communication command.

In addition, when lower communication control circuit 72 of voltage detection circuit 4 reads the communication command and finds that voltage detection circuit 4 is a target of the communication command, lower communication control circuit 72 outputs a lower reply request signal. Reply output circuit 22 outputs battery information as a reply. Lower selection circuit 73 selects the reply, and outputs the reply to the lower side. The output reply is transferred to the lower side by upper communication transfer circuit 54 and lower selection circuit 73 of voltage detection circuit 5, and is received by the MCU via first communication circuit 11.

Likewise, when the MCU sends the communication command for reading battery information from voltage detection circuit 1, to the upper side of voltage detection circuit 1 via second communication circuit 12, the communication command is transferred to voltage detection circuit 2 specified by the upper communication end information. Voltage detection circuit 1 which is a target of the communication command outputs the battery information as a reply to the upper side. The reply is received by the MCU via second communication circuit 12.

In addition, although voltage measurement device 100 according to Embodiment 1 determines voltage detection circuit 1 and voltage detection circuit 4 to be the targets of the communication command, it is possible to determine any of the voltage detection circuits to be targets because the communication command is transferred to all the voltage detection circuits through communication from both of the upper side and the lower side.

In addition, voltage measurement device 100 according to Embodiment 1 is capable of stopping transfer of a communication command by using upper communication end information and lower communication end information. Even when a failure has occurred in a voltage detection circuit connected in a daisy chain, it is possible to perform communication from the MCU to all the voltage detection circuits through communication from both the upper side and the lower side. Furthermore, it is possible to prevent a communication command from reaching a failure part, thereby being able to prevent occurrence of electrical abnormality such as current increase.

In addition, collision between communication from the upper side and communication from the lower side can be prevented, which makes it possible to execute communication from both the upper side and the lower side in parallel so as to reduce processing time.

The presence/absence of transfer of a communication command can be judged based not on a reading result of the communication command but on lower communication end information and upper communication end information which have been set in advance. Thus, the transfer of the communication command can be performed at high speed.

Figure 3A:
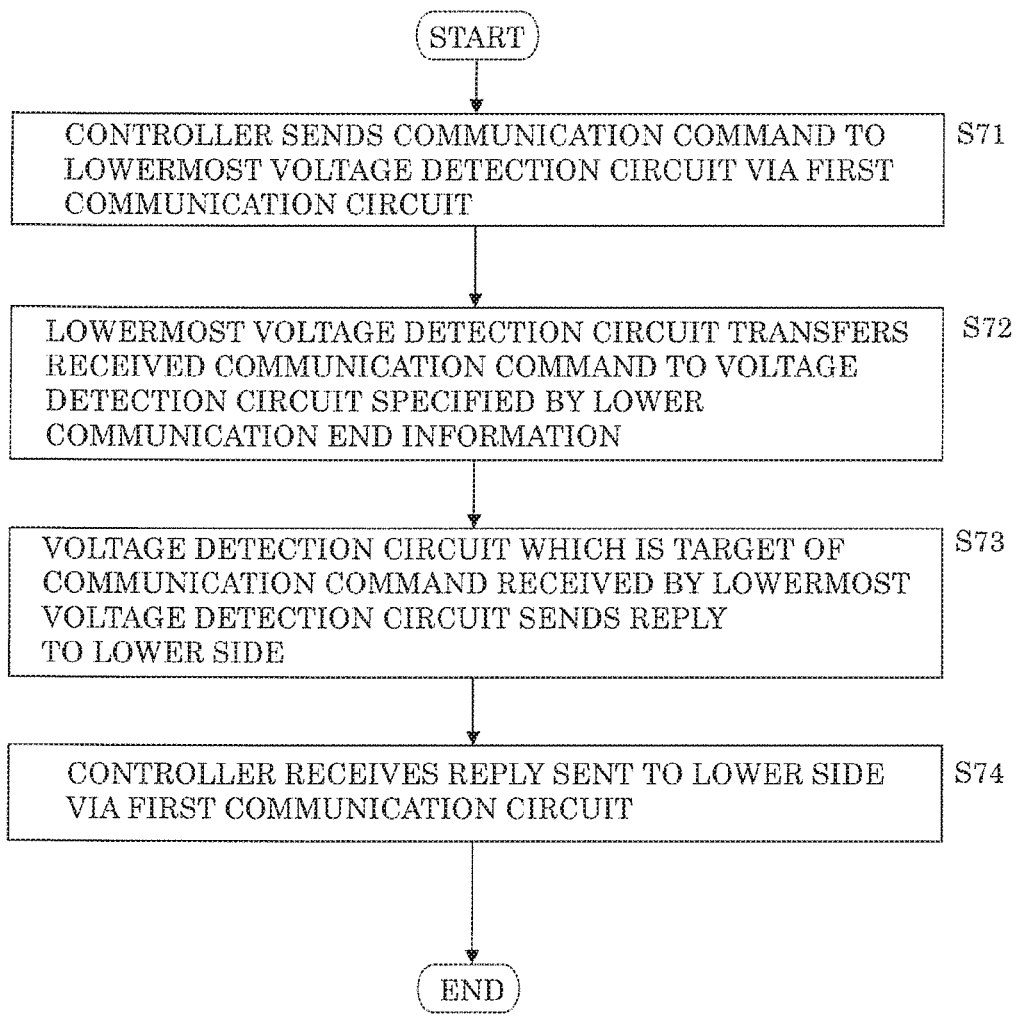
FIG. 3A is a diagram explaining a voltage measurement method according to Embodiment 1.
Figure 3B:
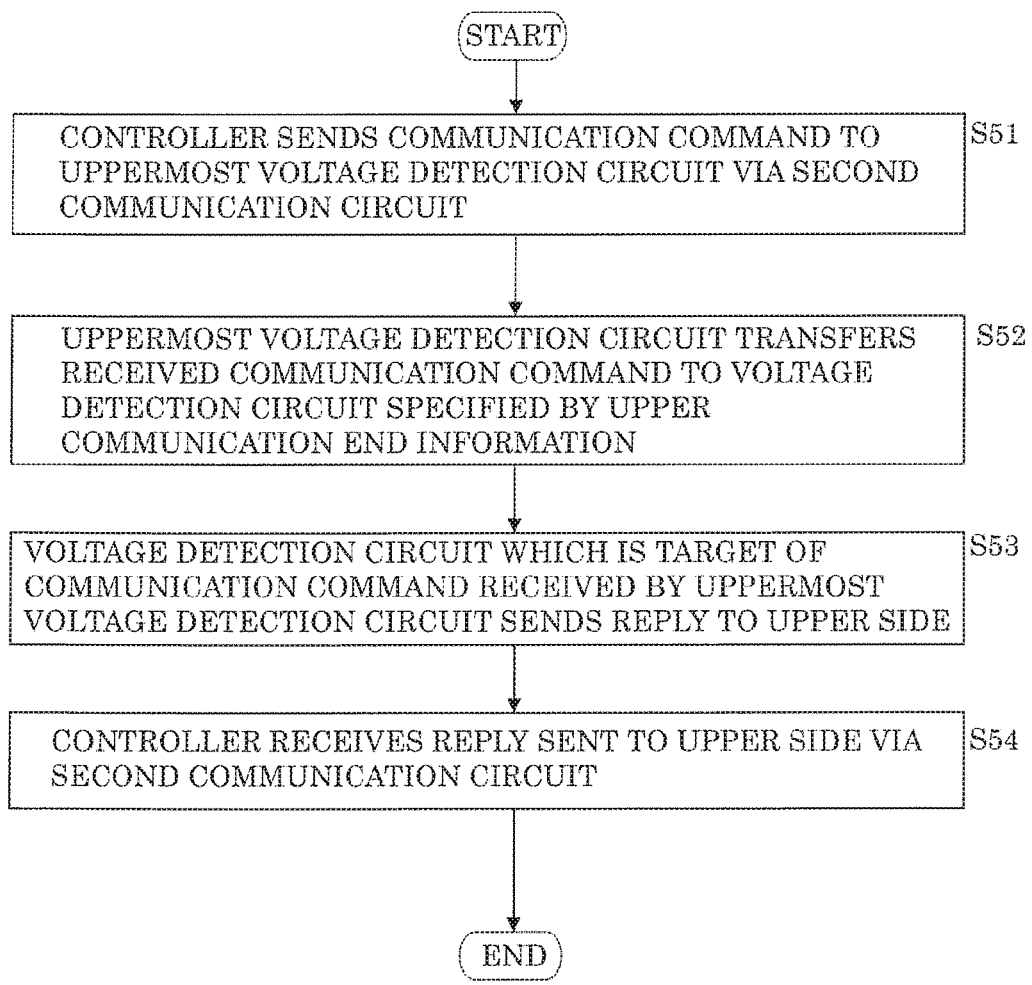
FIG. 3B is a diagram explaining the voltage measurement method according to Embodiment 1.
Figure 4:
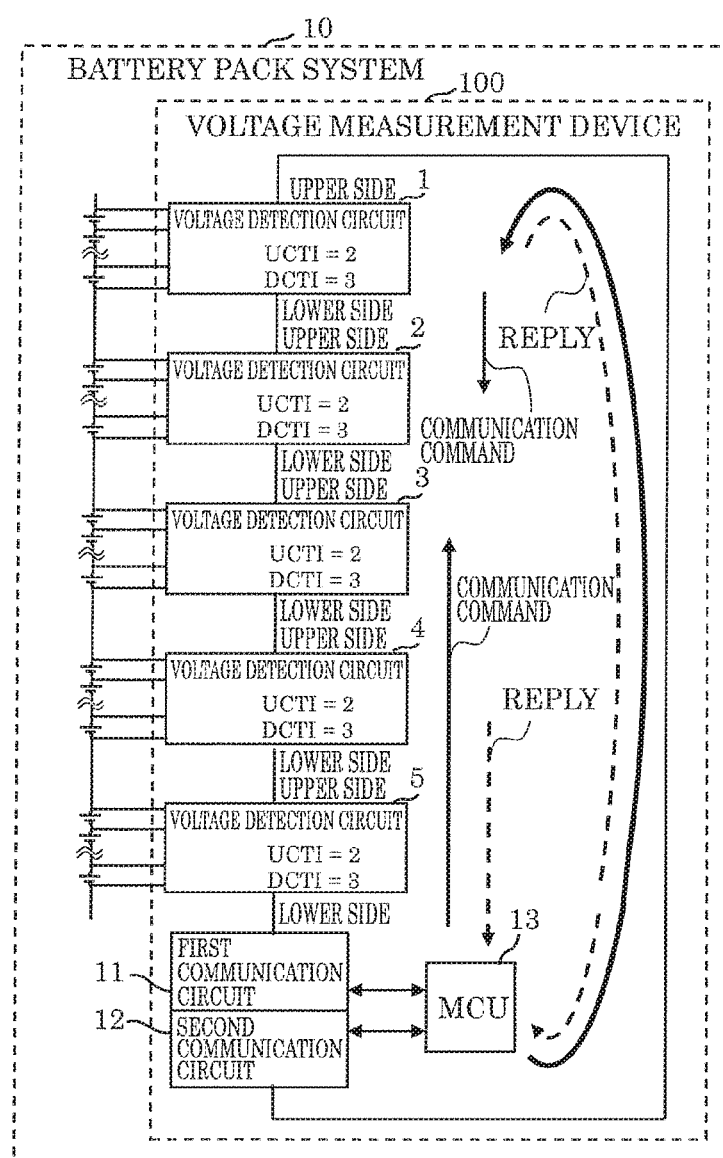
FIG. 4 is a configuration diagram of the battery pack system which includes the voltage measurement device including the voltage detection circuits, according to Embodiment 1.

Next, each of FIGS. 3A and 3B indicates a voltage measurement method according to Embodiment 1. FIG. 3A indicates a case where controller 13 sends a communication command from a lower side, and FIG. 3B indicates a case where controller 13 sends a communication command from an upper side. In addition, FIG. 4 is a diagram illustrating an operation example in voltage measurement device 100. In the diagram, upper communication end information and lower communication end information are abbreviated as UCTI and LCTI, respectively.

The voltage measurement device according to Embodiment 1 includes: a plurality of voltage detection circuits which measure cell voltages of battery pack 200 which is configured to include a plurality of cells 20 connected in series; controller 13; first communication circuit 11; and second communication circuit 12. The plurality of voltage detection circuits are connected in a daisy chain. Controller 13 is connected to a lowermost voltage detection circuit located at a lowermost stage via first communication circuit 11, is connected to an uppermost voltage detection circuit located at an uppermost stage via second communication circuit, and sends a communication command. The voltage detection circuit described above includes: upper communication end information holding circuit 51 which holds upper communication end information; and lower communication end information holding circuit 71 which holds lower communication end information.

As illustrated in FIGS. 3A and 3B, the voltage detection method includes: a step (S71) in which controller 13 sends a communication command to the lowermost voltage detection circuit via first communication circuit 11; a step (S72) in which the lowermost voltage detection circuit transfers the received communication command to the voltage detection circuit specified by the lower communication end information; a step (S73) in which the voltage detection circuit which is a target of the communication command received by the lowermost voltage detection circuit sends a reply to the lower side; and a step (S74) in which controller 13 receives the reply sent to the lower side via first communication circuit 11. The voltage detection method further includes: a step (S51) in which controller 13 sends a communication command to the uppermost voltage detection circuit via second communication circuit 12; a step (S52) in which the uppermost voltage detection circuit transfers the received communication command to the voltage detection circuit specified by the upper communication end information; a step (S53) in which the voltage detection circuit which is a target of the communication command received by the uppermost voltage detection circuit sends a reply to the upper side; and a step (S54) in which controller 13 receives the reply sent to the upper side via second communication circuit 12.

In addition, battery pack system 10 according to Embodiment 1 includes: voltage measurement device 100; and battery pack 200 configured to include a plurality of cells 20 connected in series.

VARIATIONS OF EMBODIMENT 1

Figure 5:
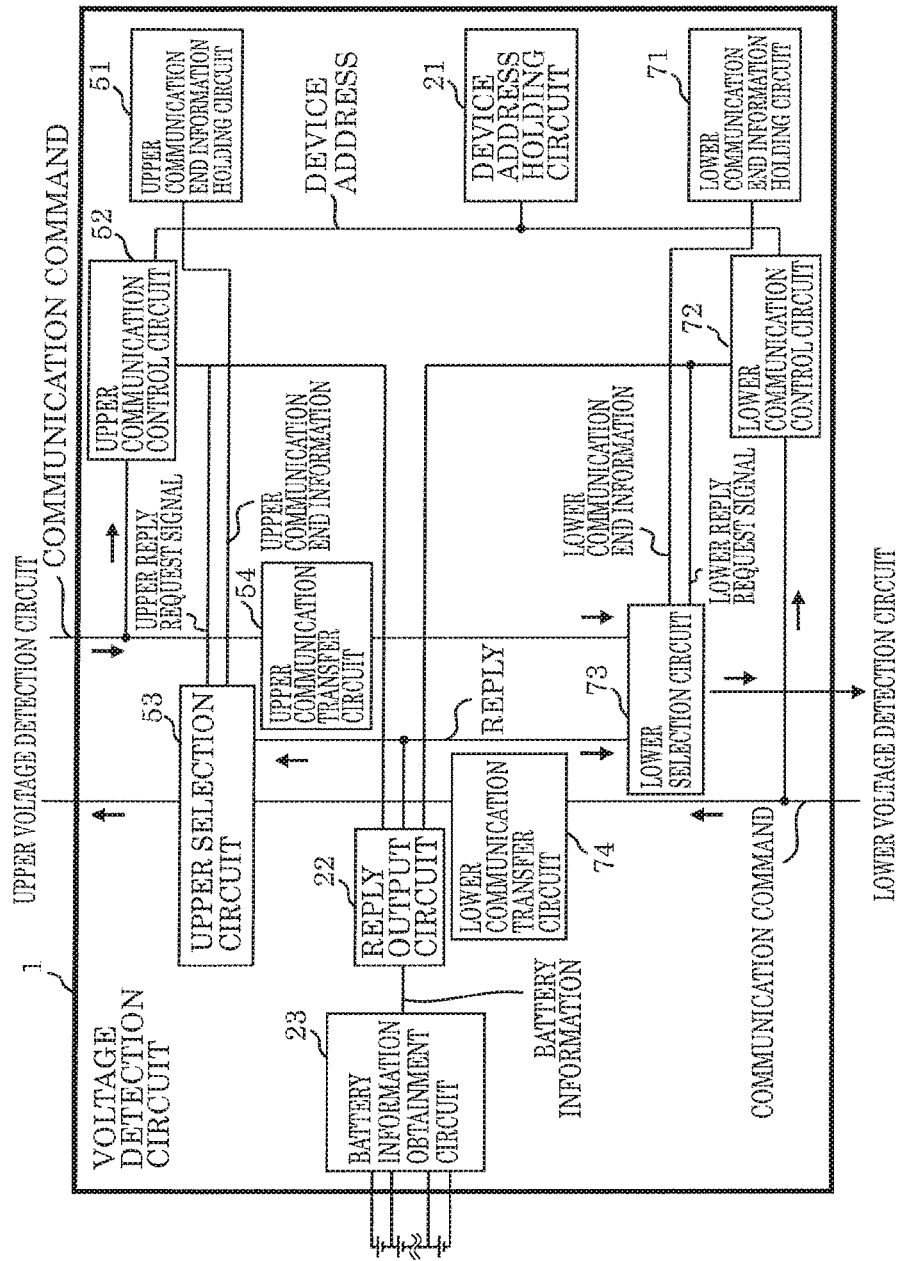
FIG. 5 is a configuration diagram of a voltage detection circuit which is included in the voltage measurement device included in the battery pack system, according to Embodiment 1.

FIG. 5 illustrates a block diagram of a voltage detection circuit according to a variation.

The voltage detection circuit illustrated here is different from the voltage detection circuit illustrated in FIG. 2A in that upper communication end information is input to upper selection circuit 53 instead of lower communication end information, and that lower communication end information is input to lower selection circuit 73 instead of upper communication end information.

In this variation, a communication command from a lower voltage detection circuit located below a current voltage detection circuit is transferred from lower communication transfer circuit 74 to upper selection circuit 53. When the current voltage detection circuit is not the voltage detection circuit which is specified by the upper communication end information, the communication command is selected by upper selection circuit 53, and is output to an upper voltage detection circuit located above the current voltage detection circuit.

In addition, a communication command from an upper voltage detection circuit located above the current voltage detection circuit is transferred from upper communication transfer circuit 54 to lower selection circuit 73. When the current voltage detection circuit is not the voltage detection circuit which is specified by the lower communication end information, the communication command is selected by lower selection circuit 73, and is output to a lower voltage detection circuit located below the current voltage detection circuit.

The other operations are the same as in the voltage detection circuit in FIG. 2A.

Figure 6:
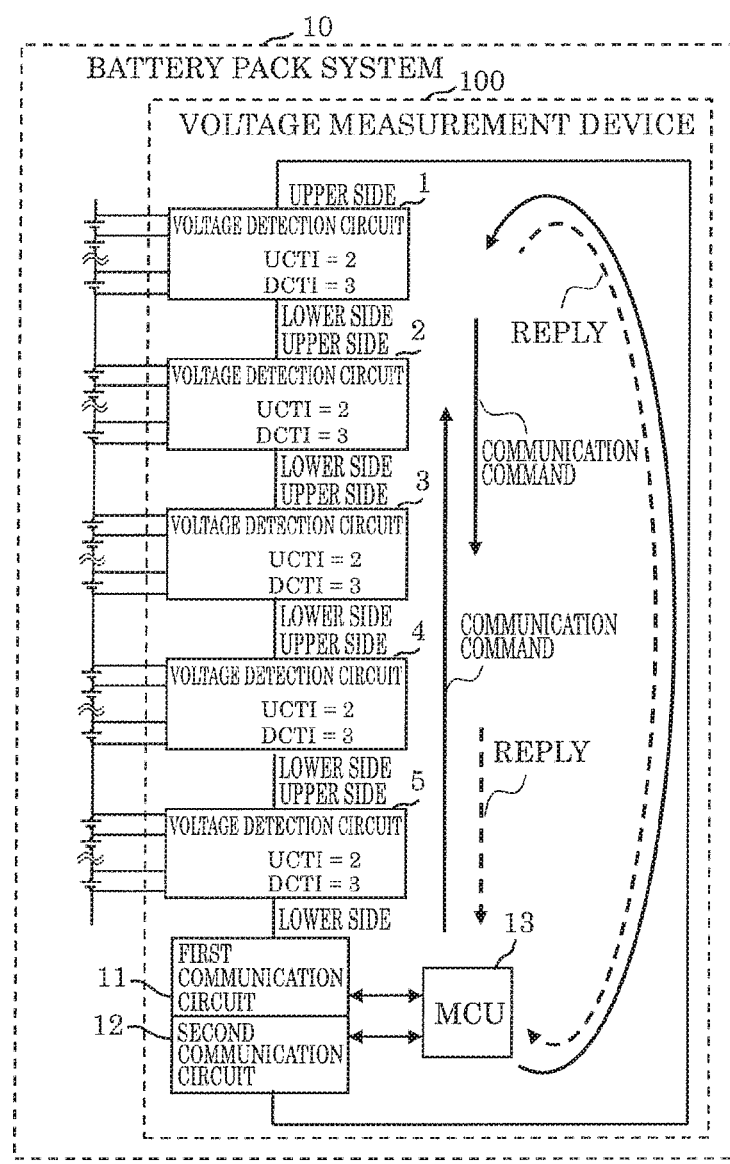
FIG. 6 is a configuration diagram of the battery pack system which includes the voltage measurement device including the voltage detection circuits, according to Embodiment 1.

Next, FIG. 6 illustrates an operation example in the case where no failure is present in a communication path, and illustrates communication commands and replies in the case where the voltage detection circuit in FIG. 5 is used.

As illustrated in FIG. 6, 3 is set to lower communication end information indicating a final application destination of a communication command from a lower side, and 2 is set to upper communication end information indicating a final application destination of a communication command from an upper side.

In addition, when an MCU sends a communication command for reading battery information from voltage detection circuit 4, to the lower side of voltage detection circuit 5 via first communication circuit 11, voltage detection circuit 5 and voltage detection circuit 4 which are not specified by the upper communication end information transfer the communication command to the upper side of voltage detection circuit 5 via lower communication transfer circuit 74 and upper selection circuit 53. Voltage detection circuit 2 is specified by the upper communication end information, and thus does not transfer the communication command.

In addition, when lower communication control circuit 72 of voltage detection circuit 4 reads the communication command and finds that voltage detection circuit 4 is a target of the communication command, lower communication control circuit 72 outputs a lower reply request signal. Reply output circuit 22 outputs battery information as a reply. Lower selection circuit 73 selects the reply, and outputs the reply to the lower side. The output reply is transferred to the lower side by upper communication transfer circuit 54 and lower selection circuit 73 of voltage detection circuit 5, and is received by the MCU via first communication circuit 11.

Likewise, when the MCU sends the communication command for reading battery information from voltage detection circuit 1 to the upper side of voltage detection circuit 1 via second communication circuit 12, the communication command is transferred to voltage detection circuit 3 specified by the lower communication end information. Voltage detection circuit 1 which is a target of the communication command outputs the battery information as a reply to the upper side. The reply is received by the MCU via second communication circuit 12.

In this variation, when no abnormality is present on the communication path, a command sent from both the upper side and the lower side in a daisy chain is transferred further ahead, which makes it possible to equalize currents to be consumed in the respective voltage detection circuits.

Variation 1

Furthermore, a first variation in Embodiment 1 is described.

Figure 1B:
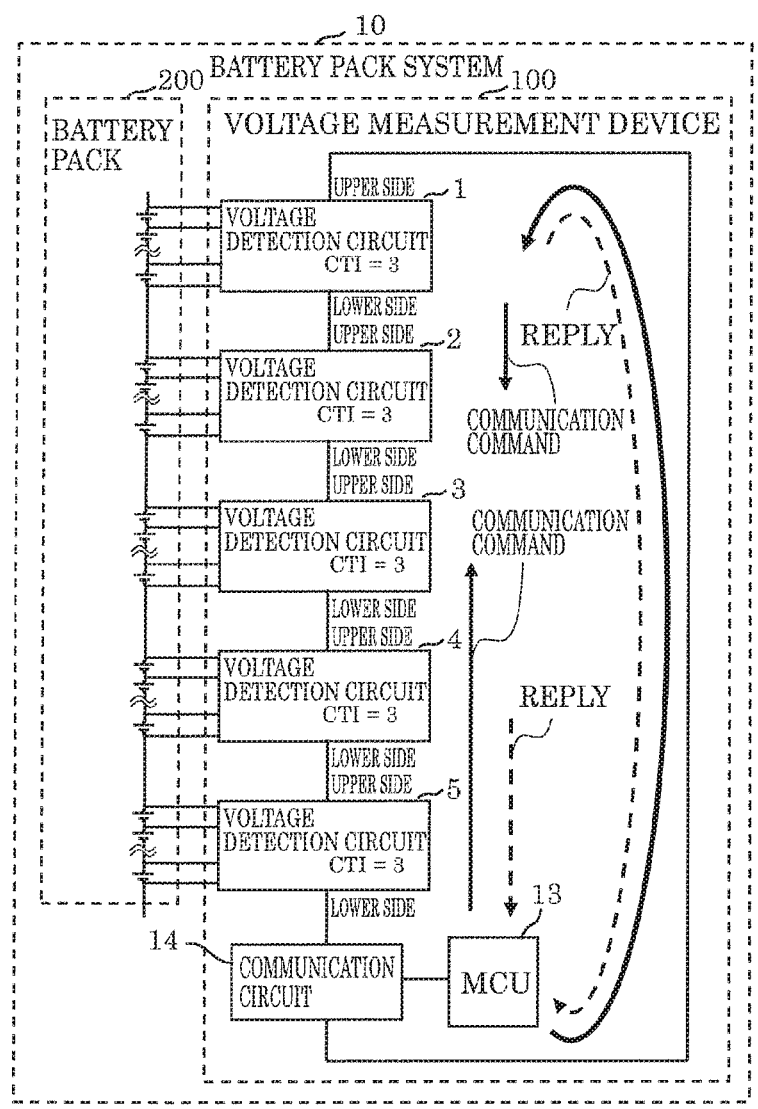
FIG. 1B is a diagram illustrating a variation of the battery pack system which includes the voltage measurement device including the voltage detection circuits according to Embodiment 1.

FIG. 1B is a diagram illustrating a variation of the battery pack system which includes the voltage measurement device including the voltage detection circuits according to Embodiment 1. Unlike FIG. 1A, FIG. 1B illustrates that communication end information (abbreviated as CTI in the diagram) is held as a replacement for upper communication end information and lower communication end information.

Figure 2B:
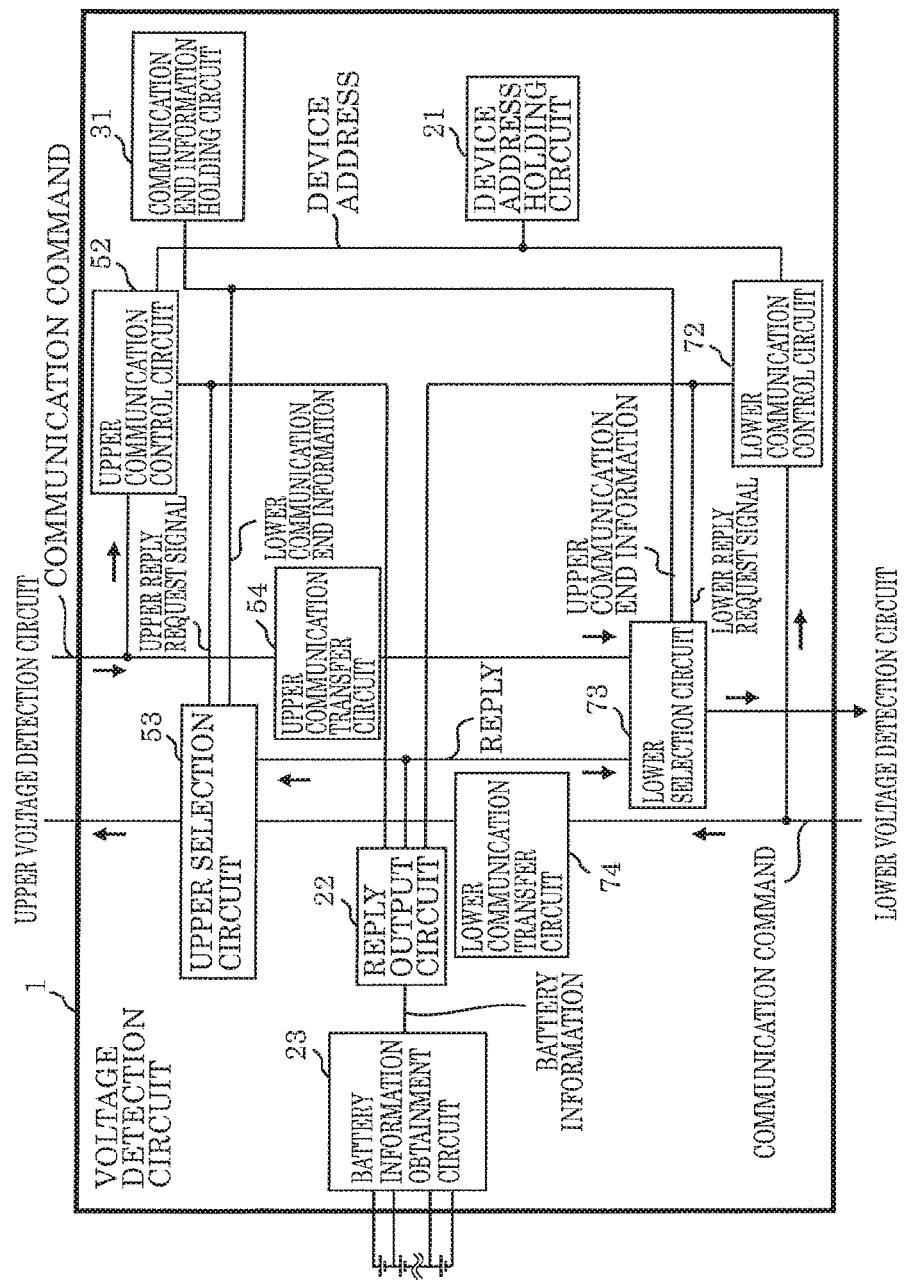
FIG. 2B is a diagram illustrating a first variation of the voltage detection circuit according to Embodiment 1.

In addition, FIG. 2B is a diagram illustrating a first variation of the voltage detection circuit according to Embodiment 1. Unlike FIG. 2A, FIG. 2B illustrates that communication end information holding circuit 31 is provided as a replacement for upper communication end information holding circuit 51 and lower communication end information holding circuit 71. The following description is given mainly focusing on differences therebetween.

Communication end information holding circuit 31 holds communication end information as a common replacement for upper communication end information and lower communication end information.

First, a description is given of an example of receiving a command from the lower side in each of FIG. 1B and FIG. 2B.

A communication command from a lower voltage detection circuit located below a current voltage detection circuit is transferred from a lower communication transfer circuit to an upper selection circuit. When the current voltage detection circuit is not the voltage detection circuit specified by the communication end information, the communication command is selected by the upper selection circuit, and is output to an upper voltage detection circuit located above the current voltage detection circuit. For example, when communication end information indicates 3, the voltage detection circuit located at the third position from the uppermost stage does not transfer the communication command, and a voltage detection circuit located at the lower side below the voltage detection circuit at the third position transfers the communication command.

A lower reply request signal is output when the lower communication transfer circuit reads the communication command from the voltage detection circuit located at the lower side and finds that the current voltage detection circuit is a target of the communication command (a device address indicated by the communication command matches a value in a device address holding circuit). In response to the lower reply request signal; the reply output circuit outputs a reply such as battery information obtained by a battery information obtainment circuit and corresponding to the communication command; and lower selection circuit selects the reply and outputs the reply to the voltage detection circuit located at the lower side.

Next, a description is given of an example of receiving a communication command from the upper side in each of FIG. 1B and FIG. 2B.

A communication command from an upper voltage detection circuit located above a current voltage detection circuit is transferred from the upper communication transfer circuit to the lower selection circuit. When the current voltage detection circuit is not the voltage detection circuit specified by the communication end information, the communication command is selected by the lower selection circuit, and is output to a lower voltage detection circuit located below the current voltage detection circuit.

For the communication command from the upper side, a voltage detection circuit is specified based on a value obtained by subtracting 1 from communication end information.

For example, when communication end information indicates 3, the voltage detection circuit located at the second position from the uppermost stage does not transfer the communication command, and a voltage detection circuit located at the upper side above the voltage detection circuit at the second position transfers the communication command to the lower side.

An upper communication control circuit reads the communication command from the voltage detection circuit located at the upper side, and outputs an upper reply request signal when the voltage detection circuit is a target of the communication command. In response to the upper reply request signal: a reply output circuit outputs a reply which is for example battery information obtained by a battery information obtainment circuit and corresponds to the communication command; and the upper selection circuit selects the reply and outputs the reply to the voltage detection circuit at the upper side.

For example, when a communication path between voltage detection circuit 2 and voltage detection circuit 3 is broken, 3 as communication end information is stored in a communication end information holding circuit by performing such a single operation as described above.

When communication end information indicates 3, voltage detection circuit 3 is specified for a communication command from the lower side, and the communication control circuit of voltage detection circuit 3 prohibits transfer of the communication command to voltage detection circuit 2.

When communication end information indicates 3, voltage detection circuit 2 is specified for a communication command from the upper side based on the value obtained by subtracting 1 from 3, and the communication control circuit of voltage detection circuit 2 prohibits transfer of the communication command to voltage detection circuit 3.

In this way, the communication end information prohibits transfer of the communication command to the failed communication path, thereby being able to reduce occurrence of abnormal current, destruction, malfunction, etc.

This effect can be obtained both when communication is performed only from either the lower side or the upper side or in both directions.

Variation 2

Next, a second variation in Embodiment 1 is described.

Each of FIGS.' 2C to 2E is a diagram illustrating a second variation of the voltage detection circuit according to Embodiment 1.

Figure 2C:
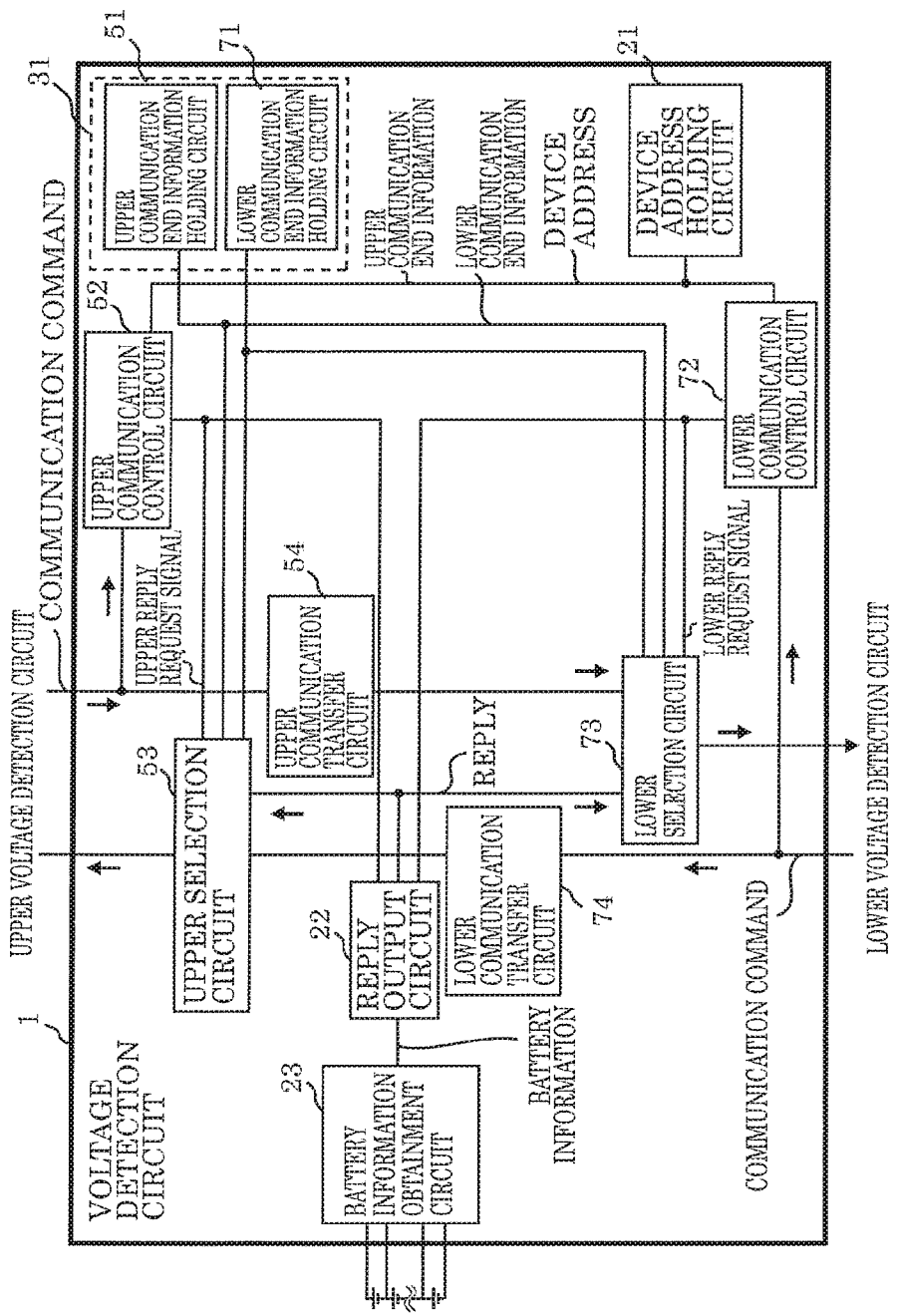
FIG. 2C is a diagram illustrating a second variation of the voltage detection circuit according to Embodiment 1.

FIG. 2C illustrates a configuration example in which communication end information holding circuit 31 includes upper communication end information holding circuit 51 and lower communication end information holding circuit 71, and upper communication end information holding circuit 51 and lower communication end information holding circuit 71 are switchable.

Describing in detail, the communication control circuit selectively switches a first operation mode and a second operation mode.

Figure 2D:
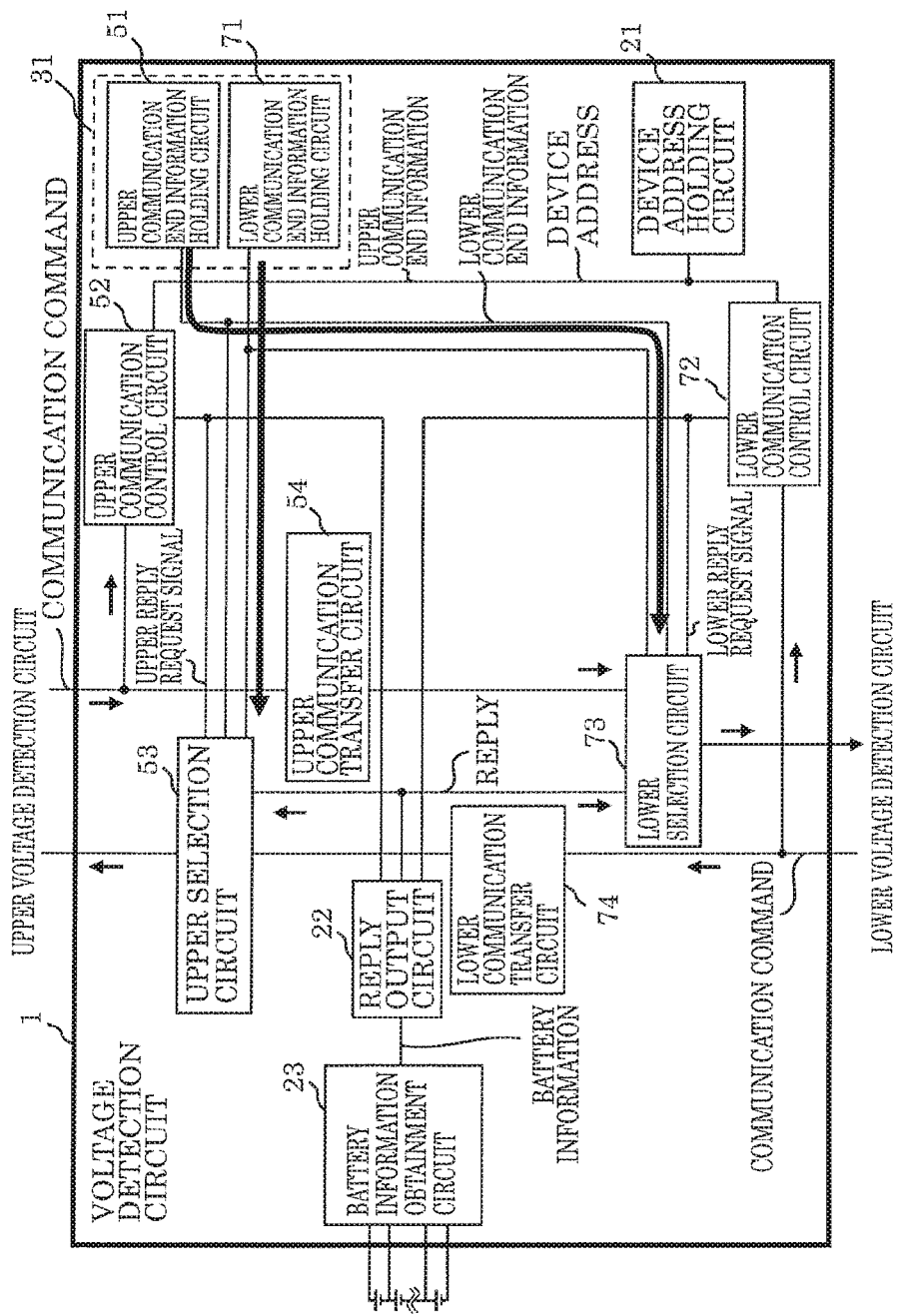
FIG. 2D is a diagram illustrating an operation example in the second variation of the voltage detection circuit according to Embodiment 1.

Here, as illustrated in FIG. 2D, the first operation mode is for controlling whether to allow or prohibit transfer of a communication command that flows in a first direction (for example, from an upper side to a lower side) according to upper communication end information, and is for performing control as to whether to allow or prohibit transfer of a communication command that flows in a second direction according to lower communication end information.

Figure 2E:
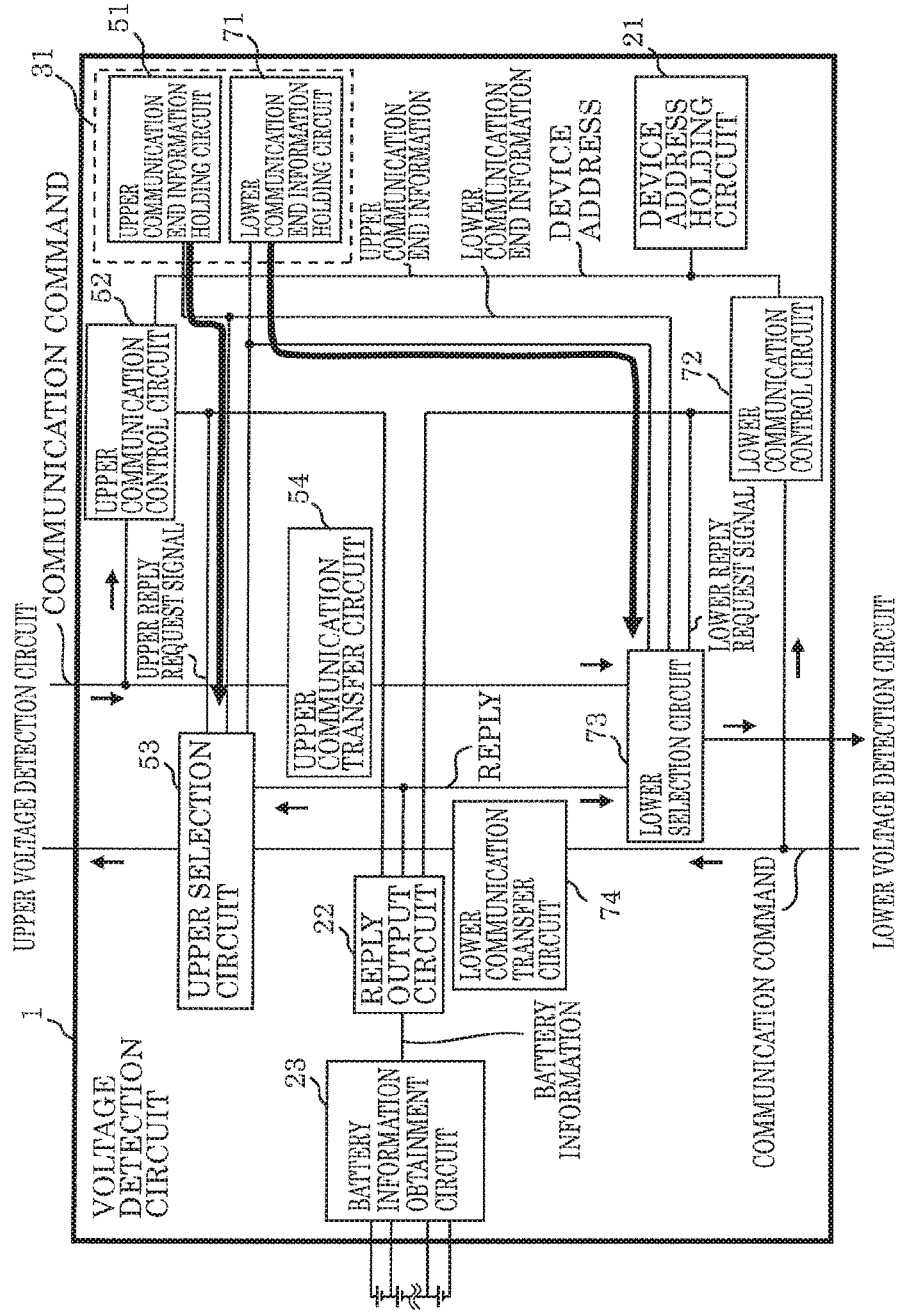
FIG. 2E is a diagram illustrating an operation example in the second variation of the voltage detection circuit according to Embodiment 1.

As illustrated in FIG. 2E, the second operation mode is for controlling whether to allow or prohibit transfer of a communication command that flows in a first direction according to lower communication end information, and is for performing control as to whether to allow or prohibit transfer of a communication command that flows in a second direction according to upper communication end information.

Other Variations

FIG. 2F is a diagram illustrating another variation of the voltage detection circuit according to Embodiment 1.

Battery information obtainment circuit 23 obtains a voltage of at least one cell as battery information. For example, as illustrated in FIG. 1A, battery information obtainment circuit 23 may obtain voltages of a plurality of cells 20. Alternatively, as illustrated in FIG. 2F, battery information obtainment circuit 23 may obtain a voltage of single cell 20.

As described above, voltage measurement device 100 according to Embodiment 1 is a voltage measurement device including a plurality of voltage detection circuits which measure cell voltages of a plurality of cells connected in series. The voltage detection circuit includes: a communication end information holding circuit which holds communication end information specifying, as a communication end position, any one of the plurality of voltage detection circuits; and a communication control circuit which controls transfer for sending a communication command received from a preceding voltage detection circuit located at a preceding stage to a next voltage detection circuit located at a next stage according to the communication end information.

Here, the communication control circuit may allow the transfer when the communication end information does not specify a voltage detection circuit including the communication control circuit, and may prohibit the transfer when the communication end information specifies the voltage detection circuit including the communication control circuit.

Here, the plurality of voltage detection circuits are connected in a daisy chain communicatively in both directions which are a first direction and a second direction opposite to each other. The communication control circuit may control whether to allow or prohibit each of the transfer in the first direction and the transfer in the second direction, according to the communication end information.

Here, the communication control circuit may control sending of a reply to the preceding voltage detection circuit when the communication control circuit has received the communication command from the preceding voltage detection circuit.

Here, the voltage measurement device may include a controller which is connected to a voltage detection circuit located at a lowermost stage among the plurality of voltage detection circuits, is connected to a voltage detection circuit located at an uppermost stage, sends the communication command, and receives the reply.

Here, the communication end information may include upper communication end information specifying a first communication end position which is included in the at least one communication end position, and lower communication end information specifying a second communication end position which is included in the at least one communication end position. The communication control circuit may control whether to allow or prohibit the transfer of the communication command that flows in the first direction according to the upper communication end information, and may control whether to allow or prohibit the transfer of the control command that flows in the second direction according to the lower communication end information.

Here, when it is assumed that the voltage detection circuit corresponding to a last cell in a negative side of the plurality of cells is the voltage detection circuit located at the lowermost stage and that the voltage detection circuit corresponding to a last cell in a positive side of the plurality of cells is the voltage detection circuit located at the uppermost stage, the first direction may be a direction in which the communication command flows from the uppermost stage to the lowermost stage.

Here, when it is assumed that the voltage detection circuit corresponding to a last cell in a negative side of the plurality of cells is the voltage detection circuit located at the lowermost stage and that the voltage detection circuit corresponding to a last cell in a positive side of the plurality of cells is the voltage detection circuit located at the uppermost stage, the first direction may be a direction in which the communication command flows from the lowermost stage to the uppermost stage.

Here, the communication control circuit may selectively switch the first operation mode and the second operation mode. The first selection mode is a mode for performing control as to whether to allow or prohibit the transfer of the communication command that flows in the first direction according to the upper communication end information, and for controlling whether to allow or prohibit the transfer of the communication command that flows in the second direction according to the lower communication end information. The second selection mode is a mode for performing control as to whether to allow or prohibit the transfer of the communication command that flows in the first direction according to the lower communication end information, and for controlling whether to allow or prohibit the transfer of the communication command that flows in the second direction according to the upper communication end information.

Here, the voltage measurement device may include a battery pack including the plurality of cells connected in series.

In addition, the voltage detection circuit according to Embodiment 1 is a voltage detection circuit included in the plurality of voltage detection circuits included in the voltage measurement device which measure cell voltages of a plurality of cells connected in series. The voltage detection circuit includes: a communication end information holding circuit which holds communication end information specifying, as a communication end position, any one of the plurality of voltage detection circuits; and a communication control circuit which controls transfer for sending a command received from a preceding voltage detection circuit located at a preceding stage to a next voltage detection circuit located at a next stage according to the communication end information.

In addition, the voltage detection method according to Embodiment 1 is a voltage detection method in the plurality of voltage detection circuits included in the voltage measurement device which measure cell voltages of the plurality of cells connected in series. The voltage detection method involves transfer of a communication command received from a preceding voltage detection circuit located at a preceding stage to a next voltage detection circuit located at a next stage, according to communication end information specifying, as a communication end position, any one of the plurality of voltage detection circuits.

Embodiment 2

A voltage detection circuit, voltage measurement device 100, battery pack system 10, and a voltage measurement method according to Embodiment 2 are described with reference to FIG. 7 and FIG. 8 mainly focusing on differences from the counterparts in the above-described embodiment.

In voltage measurement device 100 according to Embodiment 2: upper communication control circuit 52 outputs an upper broadcast reply request signal according to upper communication end information upon detecting that the communication command from an upper side is a broadcast communication command; reply output circuit 22 outputs a reply according to the upper broadcast reply request signal; upper selection circuit 53 outputs the reply to the upper broadcast reply request signal; lower communication control circuit 72 outputs a lower broadcast reply request signal according to lower communication end information upon detecting that the communication command from a lower side is a broadcast communication command; reply output circuit 22 outputs a reply according to the lower broadcast reply request signal; and lower selection circuit 73 outputs a reply to the lower broadcast reply request signal.

Figure 7:
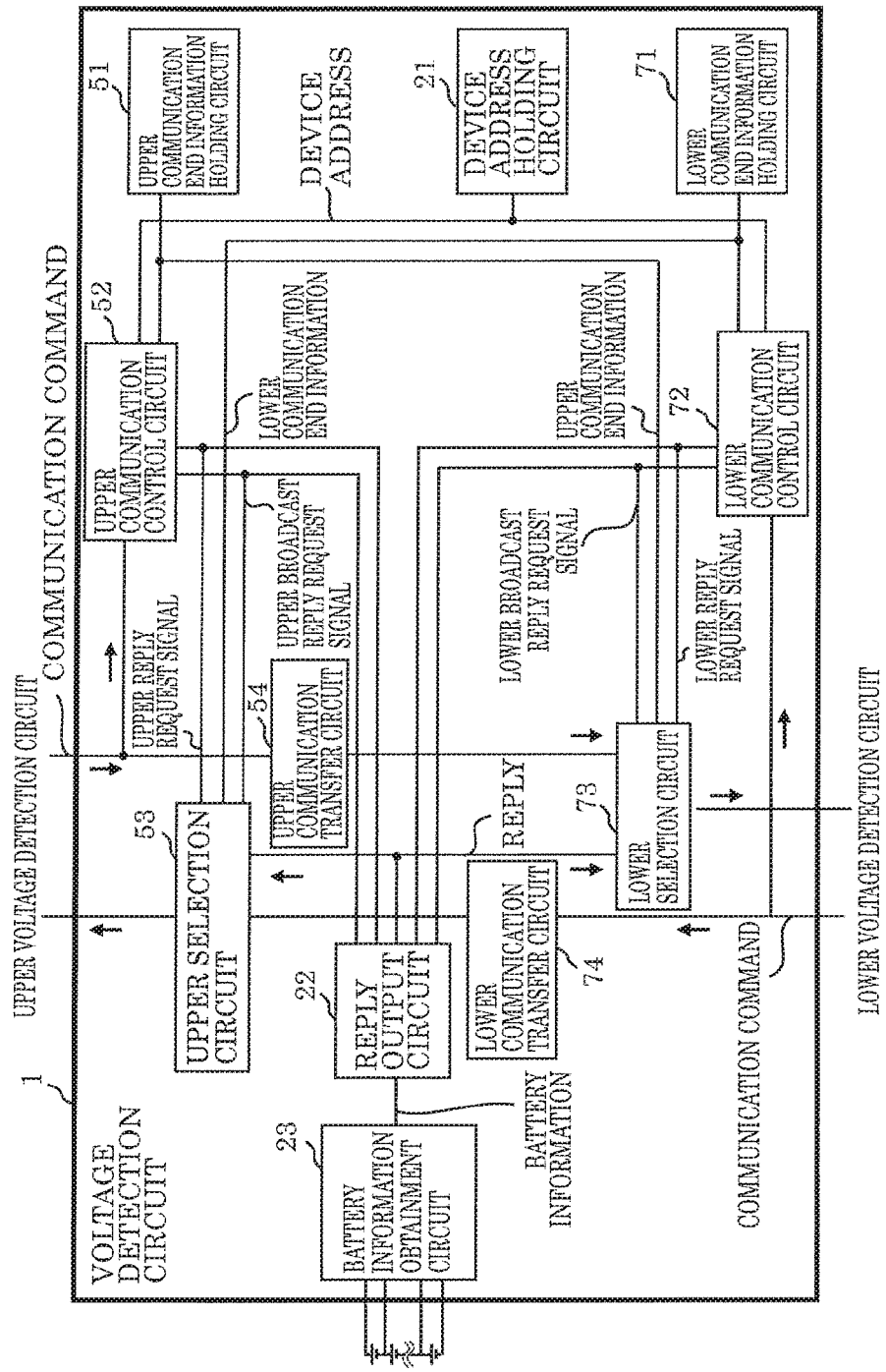
FIG. 7 is a configuration diagram of a voltage detection circuit which is included in a voltage measurement device included in a battery pack system, according to Embodiment 2.

In addition, as illustrated in FIG. 7, in the voltage detection circuit according to Embodiment 2, when lower communication control circuit 72 reads a communication command from the voltage detection circuit at the lower side and finds that a current broadcast communication command is directed to a plurality of voltage detection circuits, lower communication control circuit 72 outputs a lower broadcast reply request signal according to lower communication end information.

In addition, reply output circuit 22 outputs a reply according to a lower broadcast reply request signal. Lower selectin circuit 73 selects the reply according to the lower broadcast reply request signal and outputs the reply to the lower side.

In addition, when upper communication control circuit 52 reads a communication command from the voltage detection circuit at the upper side and finds that a current communication command is a broadcast communication command, upper communication control circuit 52 outputs an upper broadcast reply request signal according to the upper communication end information.

In addition, reply output circuit 22 outputs a reply according to an upper broadcast reply request signal. Upper selectin circuit 53 selects the reply according to the upper broadcast reply request signal and outputs the reply to the upper side.

Figure 8:
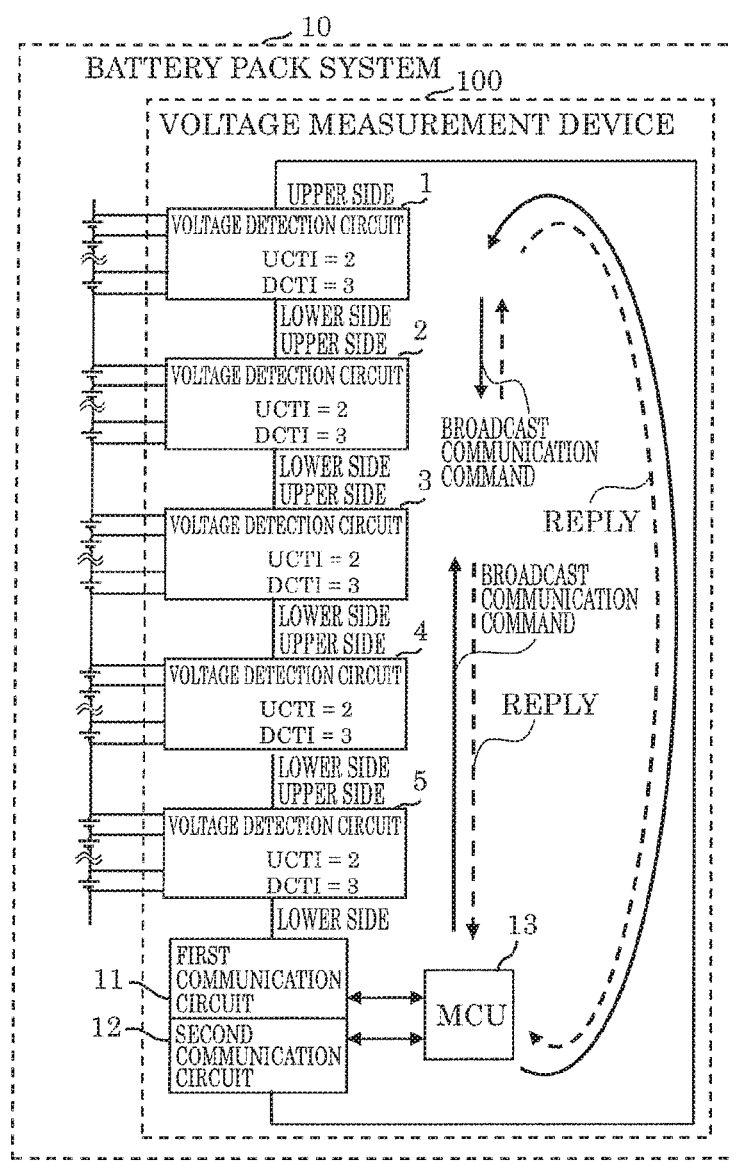
FIG. 8 is a configuration diagram of the battery pack system which includes the voltage measurement device including voltage detection circuits, according to Embodiment 2.

Next, FIG. 8 illustrates an operation example in response to a broadcast communication command, and illustrates broadcast communication commands and replies in the case where a failure is present in a communication path between voltage detection circuit 2 and voltage detection circuit 3.

As illustrated in FIG. 8, 3 is set to lower communication end information indicating a final application destination of a communication command from a lower side, and 2 is set to upper communication end information indicating a final application destination of a communication command from an upper side.

In addition, when an MCU sends a broadcast communication command to the lower side of voltage detection circuit 5 via first communication circuit 11, the broadcast communication command is transferred to voltage detection circuit 3 according to lower communication end information. When lower communication control circuit 72 of voltage detection circuit 3 reads the broadcast communication command, lower communication control circuit 72 outputs a lower broadcast reply request signal because voltage detection circuit 3 is the voltage detection circuit specified by the lower communication end information. Reply output circuit 22 outputs a reply corresponding to the broadcast communication command, according to the lower broadcast reply request signal. Lower selection circuit 73 selects a reply to the lower broadcast reply request signal, and sends the reply to the voltage detection circuit at the lower side. The reply output by voltage detection circuit 3 is transferred to the lower side sequentially by upper communication transfer circuit 54 and lower selection circuit 73 of each of voltage detection circuit 4 and voltage detection circuit 5, and is received by the MCU via first communication circuit 11.

Likewise, when the MCU sends a broadcast communication command to the upper side of voltage detection circuit 1 via second communication circuit 12, the broadcast communication command is transferred to voltage detection circuit 2 according to upper communication end information. When upper communication control circuit 52 of voltage detection circuit 2 reads the broadcast communication command, upper communication control circuit 52 outputs an upper broadcast reply request signal because voltage detection circuit 2 is the voltage detection circuit specified by the upper communication end information. Reply output circuit 22 outputs a reply corresponding to the broadcast communication command, according to the upper broadcast reply request signal. Upper selection circuit 53 selects a reply to the upper broadcast reply request signal, and sends the reply to the voltage detection circuit at the upper side. The reply output to the upper side by voltage detection circuit 2 is transferred to the upper side by lower communication transfer circuit 74 and upper selection circuit 53 of voltage detection circuit 1 and is received by the MCU via second communication circuit 12.

In addition, as illustrated in each of FIG. 7 and FIG. 8, the voltage detection circuit according to Embodiment 2 is capable of solving a problem that, if a failure part is present in a communication path, a broadcast communication command does not reach one or more voltage detection circuits at and after the failure part, when the broadcast communication command sent from the MCU is transferred from the voltage detection circuit located at the lowermost stage to the voltage detection circuit located at the uppermost stage, each of voltage detection circuits performs processing corresponding to the broadcast communication command, the uppermost voltage detection signal sends a reply, and the reply is received by the MCU via the respective voltage detection circuits.

Furthermore, the voltage detection circuit is capable of transferring the broadcast communication command to all the voltage detection circuits by sending the broadcast communication command from both the upper side and the lower side, thereby preventing a communication error that a reply cannot be returned to the MCU because the voltage detection circuit to which the reply should be sent is unknown. In other words, the voltage detection circuit is capable of preventing a communication error due to absence of a reply by specifying the voltage detection circuit that is the destination of the reply using lower communication end information and upper communication end information and sending the reply to the MCU before a communication failure part.

In addition, battery pack system 10 according to Embodiment 2 includes: voltage measurement device 100; and battery pack 200 configured to include a plurality of cells 20 connected in series.

As described above, when the communication command received from the preceding voltage circuit is the broadcast communication command, the communication control circuit in voltage measurement device 100 according to Embodiment 2 controls whether to allow or prohibit sending of the reply to the broadcast communication command to the preceding voltage detection circuit according to the communication end information.

Here, the communication control circuit may prohibit sending of the reply to the broadcast communication command when the communication end information does not specify the voltage detection circuit including the communication control circuit, and the communication control circuit may allow sending of the reply to the broadcast communication command when the communication end information specifies the voltage detection circuit including the communication control circuit.

Embodiment 3

A voltage detection circuit, voltage measurement device 100, battery pack system 10, and a voltage measurement method according to Embodiment 3 are described with reference to FIG. 9 to FIG. 10 mainly focusing on differences from the counterparts in the above-described embodiments.

In Embodiment 3, voltage measurement device 100 further includes dummy reply output circuit 24. Lower communication control circuit 72 outputs a lower dummy reply request signal when the voltage detection circuit is a target of a communication command from a lower side. Dummy reply output circuit 24 outputs a dummy reply according to the lower dummy reply request signal. Upper selection circuit 53 selects the dummy reply according to the lower dummy reply request signal and outputs the dummy reply to an upper side. Upper communication control circuit 52 outputs an upper dummy reply request signal when the voltage detection circuit is a target of a communication command from the upper side. Dummy reply output circuit 24 outputs a dummy reply according to the upper dummy reply request signal. Lower selection circuit 73 selects the dummy reply according to the upper dummy reply request signal and outputs the dummy reply to a lower side. Upper communication transfer circuit 54 transfers the communication command and the dummy reply from the upper side. Lower selection circuit 73 transfers the communication command and the dummy reply that upper communication transfer circuit 54 transfers, to the lower side according to the upper communication end information. Lower communication transfer circuit 74 transfers the communication command and the dummy reply from the lower side. Upper selection circuit 53 transfers the communication command and the dummy reply that lower communication transfer circuit 74 transfers, to the upper side according to the lower communication end information.

The above-described voltage detection circuit further includes dummy reply output circuit 24. Lower communication control circuit 72 outputs a lower dummy reply request signal when the voltage detection circuit is a target of a communication command from the lower side. Dummy reply output circuit 24 outputs a dummy reply according to the lower dummy reply request signal. Upper selection circuit 53 selects the dummy reply according to the lower dummy reply request signal and outputs the dummy reply to the upper side. Upper communication control circuit 52 outputs an upper dummy reply request signal when the voltage detection circuit is a target of a communication command from the upper side. Dummy reply output circuit 24 outputs a dummy reply according to the upper dummy reply request signal. Lower selection circuit 73 selects the dummy reply according to the upper dummy reply request signal and outputs the dummy reply to the lower side. Upper communication transfer circuit 54 transfers the communication command and the dummy reply from the upper side. Lower selection circuit 73 transfers the communication command and the dummy reply that upper communication transfer circuit 54 transfers, to the lower side according to the lower communication end information. Lower communication transfer circuit 74 transfers the communication command and the dummy reply from the lower side. Upper selection circuit 53 transfers the communication command and the dummy reply that lower communication transfer circuit 74 transfers, to the upper side according to the upper communication end information.

Hereinafter, details are described.

Figure 9:
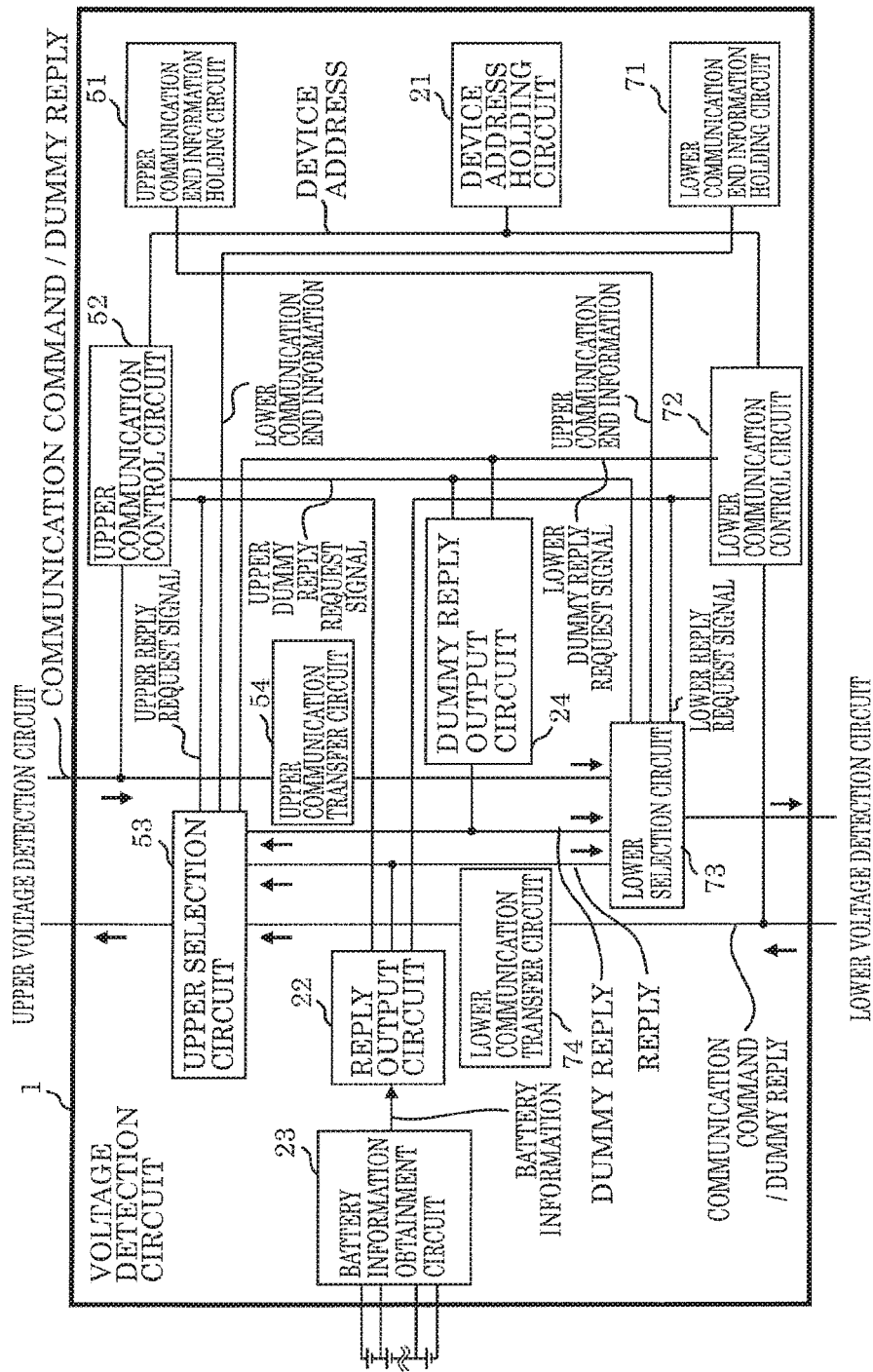
FIG. 9 is a configuration diagram of a voltage detection circuit which is included in a voltage measurement device included in a battery pack system, according to Embodiment 3.

FIG. 9 is a block diagram illustrating one of the voltage detection circuits according to Embodiment 3.

As illustrated in FIG. 9, dummy reply output circuit 24 outputs a dummy reply. The dummy reply is a signal to be sent so that a current equivalent to a current which is consumed when sending a reply is to be consumed, and is not received by an MCU.

Furthermore, lower communication control circuit 72 reads a communication command from the lower side, and outputs a lower reply request signal and a lower dummy reply request signal when the current voltage detection circuit is a target of the communication command. Upon the output of the lower dummy reply request signal, dummy reply output circuit 24 outputs a dummy reply. Upper selection circuit 53 selects the dummy reply and outputs the dummy reply to the upper side.

Likewise, upper communication control circuit 52 reads a communication command from the upper side, and outputs an upper reply request signal and an upper dummy reply request signal when the current voltage detection circuit is a target of the communication command. Upon the output of the upper dummy reply request signal, dummy reply output circuit 24 outputs a dummy reply. Upper selection circuit 73 selects the dummy reply and outputs the dummy reply to the lower side.

In addition, similarly to the transfer of a communication command, each of the voltage detection circuits located at or after the next stage: transfers the dummy reply sent from the lower side to the upper side by using lower communication transfer circuit 74 and upper selection circuit 53 according to lower communication end information; and transfers the dummy reply sent from the upper side to the lower side by using upper communication transfer circuit 54 and lower selection circuit 73 according to upper communication end information.

It is to be noted that the dummy reply from the lower side may be transferred according to upper communication end information, and the dummy reply from the upper side may be transferred according to the lower communication end information.

Figure 10:
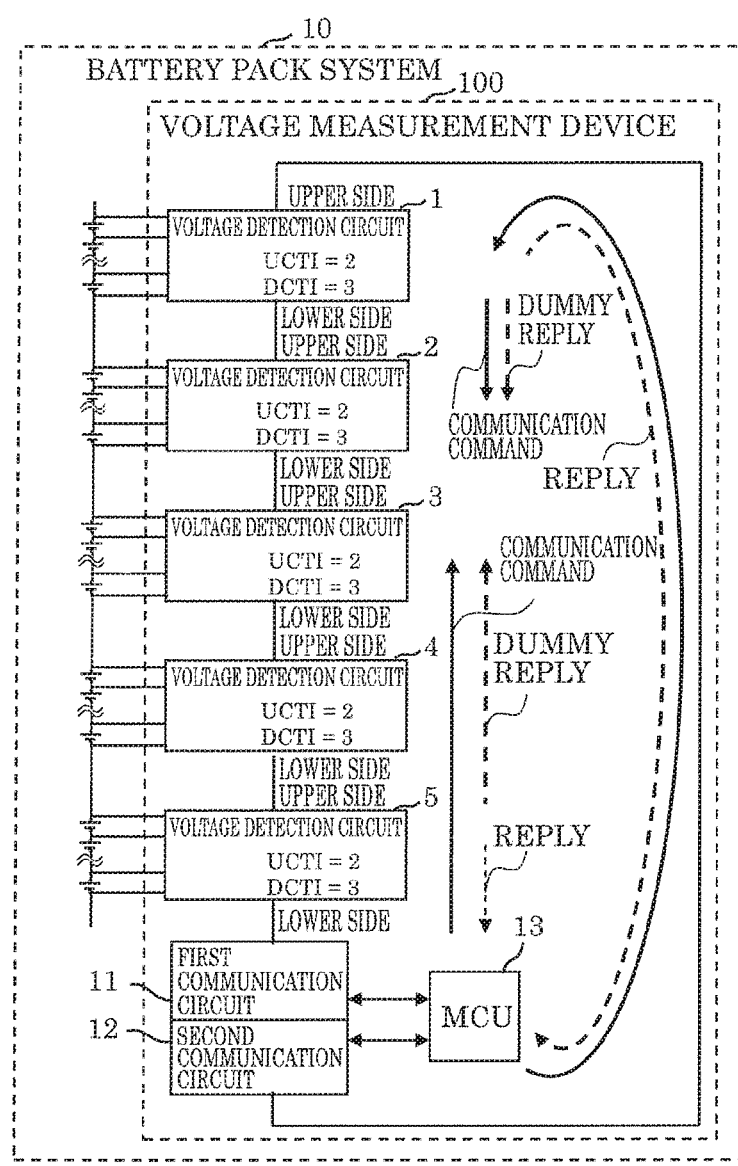
FIG. 10 is a configuration diagram of the battery pack system which includes the voltage measurement device including voltage detection circuits, according to Embodiment 3.

Next, FIG. 10 illustrates an operation example of sending of a dummy reply, and illustrates communication commands and dummy replies in the case where a failure is present in a communication path between voltage detection circuit 2 and voltage detection circuit 3.

As illustrated in FIG. 10, a target of the communication command from the lower side is voltage detection circuit 5, and a target of the communication command from the upper side is voltage detection circuit 1. The circuit specified by the lower communication end information is voltage detection circuit 3, and the circuit specified by the upper communication end information is voltage detection circuit 2.

In addition, the communication command sent by the MCU via first communication circuit 11 is transferred sequentially to the upper side by lower communication transfer circuit 74 and upper selection circuit 53 of each of voltage detection circuit 5 and voltage detection circuit 4, and is transferred to voltage detection circuit 3.

Furthermore, when lower communication control circuit 72 of voltage detection circuit 5 reads a communication command, since voltage detection circuit 5 is a target of the communication command, lower communication control circuit 72 outputs a lower dummy reply request signal. Dummy reply output circuit 24 outputs a dummy reply. Upper selection circuit 53 selects the dummy reply and outputs the dummy reply to the upper side. The dummy reply is transferred to voltage detection circuit 3 indicated by the lower communication end information as in the case of the communication command.

In addition, the communication command sent by the MCU via second communication circuit 12 is transferred to the lower side by upper communication transfer circuit 54 and lower selection circuit 73 of voltage detection circuit 1, and is transferred to voltage detection circuit 2.

In addition, when upper communication control circuit 52 of voltage detection circuit 1 reads a communication command, since voltage detection circuit 1 is a target of the communication command, upper communication control circuit 52 outputs an upper dummy reply request signal. Dummy reply output circuit 24 outputs a dummy reply. Lower selection circuit 73 selects the dummy reply and outputs the dummy reply to the lower side. The dummy reply is transferred to voltage detection circuit 2 indicated by the upper communication end information as in the case of the communication command.

It is to be noted that the dummy reply from the lower side may be transferred according to upper communication end information, and the dummy reply from the upper side may be transferred according to the lower communication end information, as in the transfer of the communication command in claim 2.

In this way, voltage measurement device 100 according to Embodiment 3 is capable of reducing variation in current to be consumed between voltage detection circuits due to sending or non-sending of a reply, by transferring a dummy reply to the voltage detection circuits indicated by the upper communication end information and the lower communication end information.

In addition, battery pack system 10 according to Embodiment 3 includes: voltage measurement device 100; and battery pack 200 configured to include a plurality of cells 20 connected in series.

As described above, in voltage measurement device 100 according to Embodiment 3, the communication control circuit performs control to cause a dummy reply to be sent to the next voltage detection circuit when the communication command received from the preceding voltage detection circuit is directed to the voltage detection circuit including the communication control circuit.

Here, when the communication control circuit has received a dummy reply from the preceding voltage detection circuit: the communication control circuit may prohibit sending of the dummy reply to the next voltage detection circuit when the communication end information specifies the voltage detection circuit including the communication control circuit; and the communication control circuit may allow sending of the dummy reply to the next voltage detection circuit when the communication end information does not specify the voltage detection circuit including the communication control circuit Here, when the voltage detection circuit including the communication control circuit is located after the voltage detection circuit which is a target of the communication command received from the preceding voltage detection circuit, the communication control circuit may perform control to cause the dummy reply to be sent to the preceding voltage detection circuit.

Embodiment 4

A voltage detection circuit, voltage measurement device 100, battery pack system 10, and a voltage measurement method according to Embodiment 4 are described with reference to FIG. 11 and FIG. 12 mainly focusing on differences from the counterparts in the above-described embodiments.

In Embodiment 4, the voltage detection circuit further includes dummy reply output circuit 24. Lower communication control circuit 72 outputs a lower dummy reply request signal when the voltage detection circuit is located after a target of a communication command from a lower side. Dummy reply output circuit 24 outputs a dummy reply according to the lower dummy reply request signal. Lower selection circuit 73 selects the dummy reply according to the lower dummy reply request signal and outputs the dummy reply to the lower side. Upper communication control circuit 52 outputs an upper dummy reply request signal when the voltage detection circuit is located after a target of a communication command from an upper side. Dummy reply output circuit 24 outputs a dummy reply according to the upper dummy reply request signal. Upper selection circuit 53 selects the dummy reply according to the upper dummy reply request signal and outputs the dummy reply to the upper side.

Figure 11:
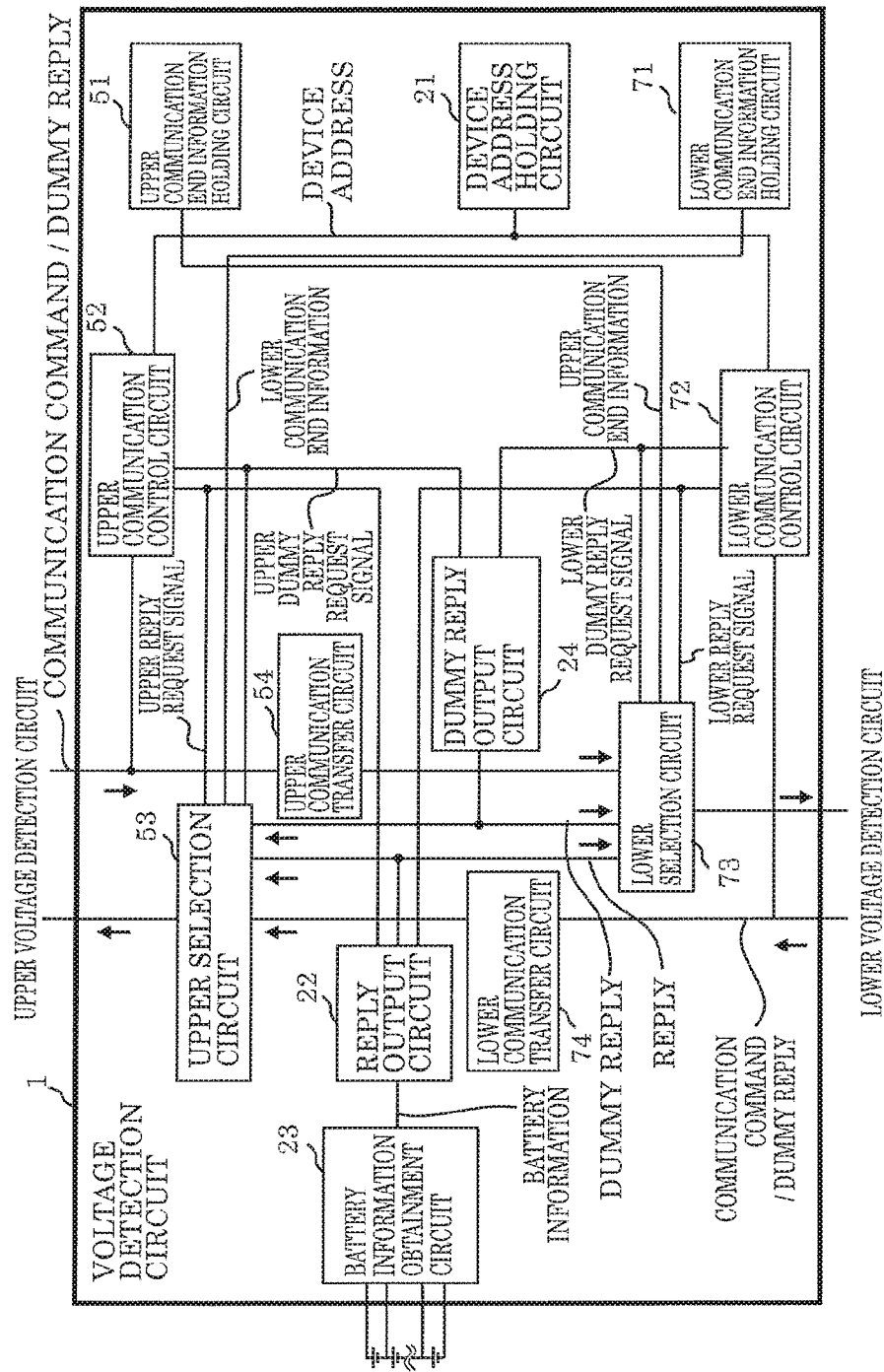
FIG. 11 is a configuration diagram of a voltage detection circuit which is included in a voltage measurement device included in a battery pack system, according to Embodiment 4.

FIG. 11 illustrates a block diagram of the voltage detection circuit according to Embodiment 4.

As illustrated in FIG. 11, lower communication control circuit 72 reads a communication command from the lower side and determines whether the voltage detection circuit is located after the target of the communication command.

Lower communication control circuit 72 is capable of determining whether the voltage detection circuit is located after the target of the communication command by comparing a device address specified as the target by the communication command and a device address held in device address holding circuit 21. When the device address in device address holding circuit 21 is smaller than the device address specified by the communication command, the voltage detection circuit is found to be located after the target of the communication command.

In addition, when the voltage detection circuit is located after the target of the communication command, lower communication control circuit 72 outputs a lower dummy reply request signal. Upon the output of the lower dummy reply request signal, dummy reply output circuit 24 outputs a dummy reply. Lower selection circuit 73 selects the dummy reply and outputs the dummy reply to the lower side.

Likewise, upper communication control circuit 52 reads a communication command from the upper side and determines whether the voltage detection circuit is located after the target of the communication command.

When the device address in device address holding circuit 21 is larger than the device address specified by the communication command, the voltage detection circuit is found to be located after the target of the communication command.

In addition, when the voltage detection circuit is located after the target of the communication command, upper communication control circuit 52 outputs an upper dummy reply request signal. Upon the output of the upper dummy reply request signal, dummy reply output circuit 24 outputs a dummy reply. Upper selection circuit 53 selects the dummy reply and outputs the dummy reply to the upper side.

It is to be noted that, in voltage measurement device 100 according to Embodiment 4, as illustrated in FIG. 5 (Embodiment 1): upper selection circuit 53 may select a communication command that lower communication transfer circuit 74 transfers according to upper communication end information and output the communication command to the upper side; and lower selection circuit 73 may select a communication command that upper communication transfer circuit 54 transfers according to lower communication end information and output the communication command to the lower side.

Figure 12:
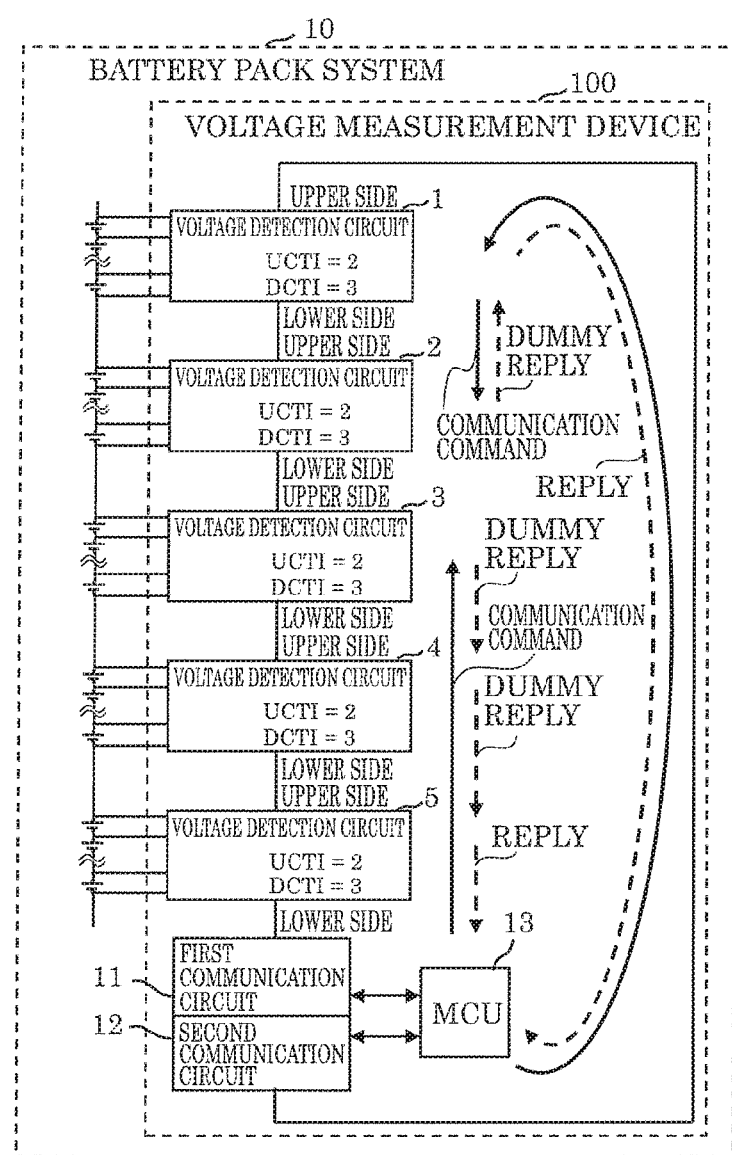
FIG. 12 is a configuration diagram of the battery pack system which includes the voltage measurement device including voltage detection circuits, according to Embodiment 4.
Figure 13:
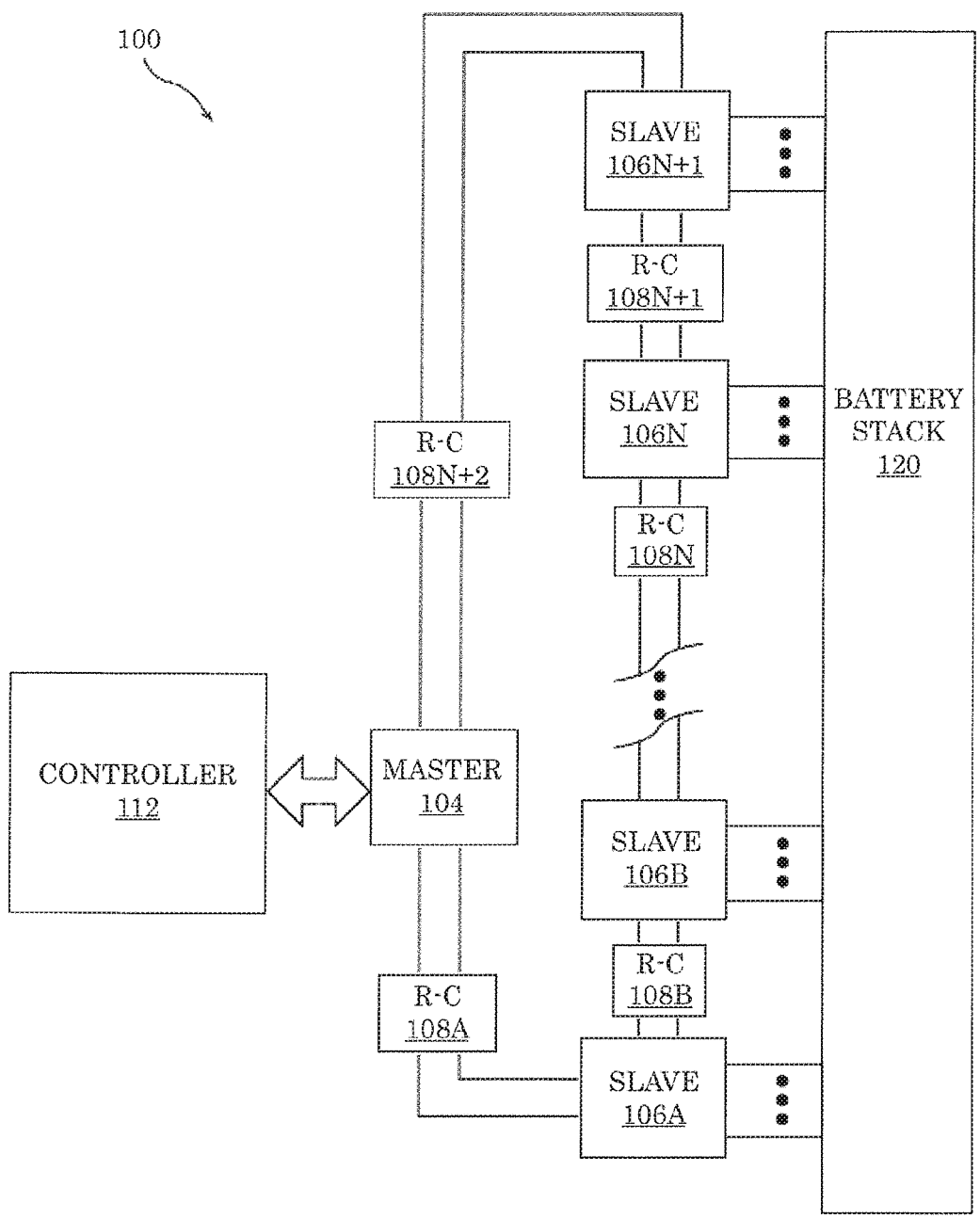
FIG. 13 is a diagram explaining a conventional technique.
Figure 14:
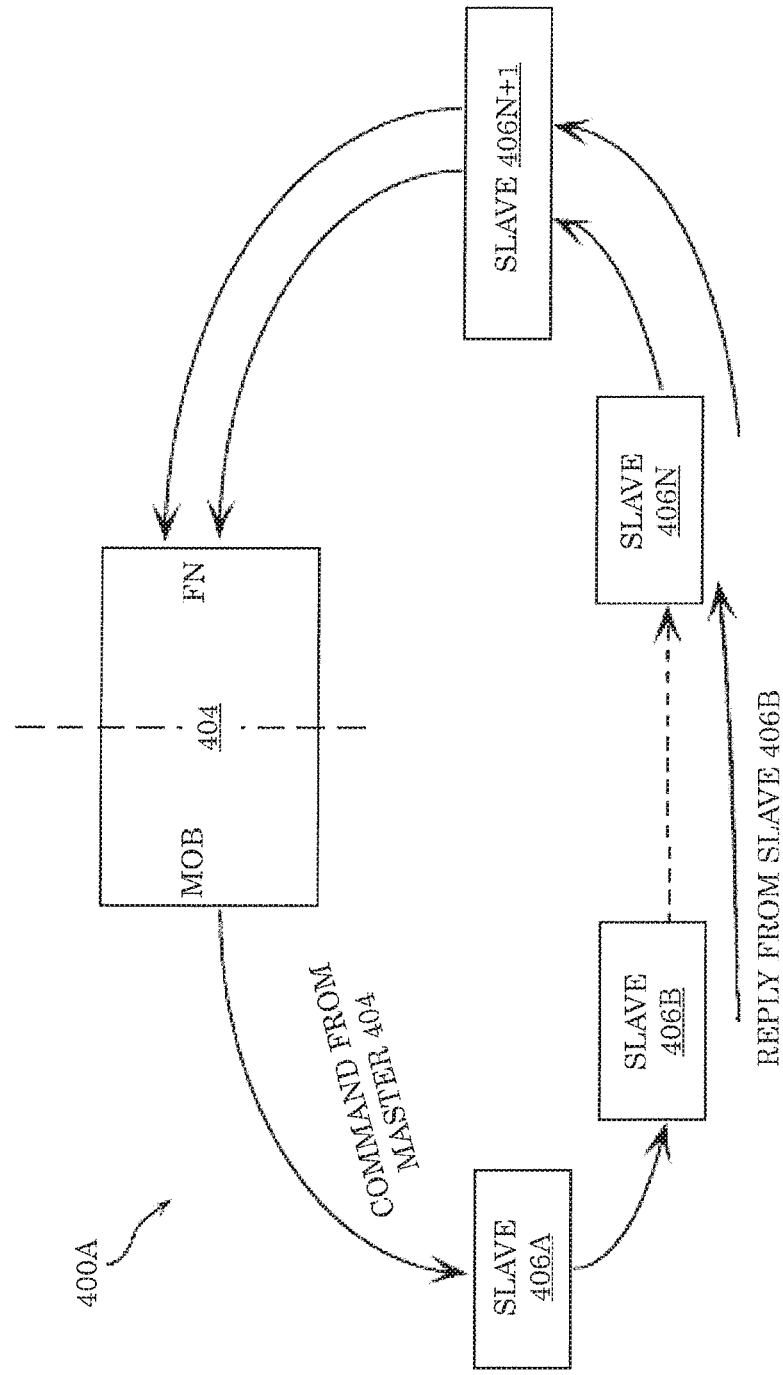
FIG. 14 is a diagram explaining a conventional technique.

Next, FIG. 12 illustrates an operation example of sending of a dummy reply, and illustrates flows of communication commands and replies in the case where a failure is present in a communication path between voltage detection circuit 2 and voltage detection circuit 3.

As illustrated in FIG. 12, a target of the communication command from a lower side is voltage detection circuit 5, and a target of the communication command from an upper side is voltage detection circuit 1. The circuit specified by the lower communication end information is voltage detection circuit 3, and the circuit specified by the upper communication end information is voltage detection circuit 2.

In addition, the communication command sent by the MCU via first communication circuit 11 is transferred sequentially to the upper side by lower communication transfer circuit 74 and upper selection circuit 53 of each of voltage detection circuit 5 and voltage detection circuit 4, and is transferred to voltage detection circuit 3.

In addition, each of the device addresses held in device address holding circuits 21 of voltage detection circuit 4 and voltage detection circuit 3 is smaller than a value of 5 that is a device address specified by the communication command, which indicates that voltage detection circuit 4 and voltage detection circuit 3 are located after the target of the communication command. Lower communication control circuit 72 of each of voltage detection circuit 4 and voltage detection circuit 3 outputs a lower dummy reply request signal. Lower selection circuit 73 selects a dummy reply which is output by dummy reply output circuit 24, and outputs the dummy reply to the lower side.

In addition, the communication command sent by the MCU via second communication circuit 12 is transferred to the lower side by upper communication transfer circuit 54 and lower selection circuit 73 of voltage detection circuit 1, and is transferred to voltage detection circuit 2.

In addition, the device address held in device address holding circuit 21 of voltage detection circuit 2 is 2 that is larger than a value of 1 that is a device address specified by the communication command, which indicates that voltage detection circuit 2 is located after the target of the communication command. Upper communication control circuit 52 of voltage detection circuit 2 outputs an upper dummy reply request signal, selects a dummy reply that is output by dummy reply output circuit 24, and outputs the dummy reply to the upper side.

It is to be noted that a current to be consumed when a dummy reply is output to the lower side and a current to be consumed when a dummy reply is output to the upper side are the same. Thus, upper selection circuit 53 may output a dummy reply to the upper side in response to a command from the lower side, and lower selection circuit 73 may output a dummy reply to the lower side in response to a command from the upper side.

In this way, voltage measurement device 100 according to Embodiment 4 is capable of reducing variation in current to be consumed between the voltage detection circuits due to sending or non-sending of a reply, by means of each of the voltage detection circuits located between the communication target and the voltage detection circuits indicated by upper communication end information and lower communication end information transferring a dummy reply.

In addition, battery pack system 10 according to Embodiment 4 includes: voltage measurement device 100; and battery pack 200 configured to include a plurality of cells 20 connected in series.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable as, for example, a voltage detection circuit for use in a vehicle, voltage measurement device 100, battery pack system 10, and a voltage measurement method.

What is claimed is:
1. A voltage measurement device, comprising:
 a plurality of voltage detection circuits which measure cell voltages of a plurality of cells connected in series,
 wherein each of the plurality of voltage detection circuits includes:
  a communication end information holding circuit which holds communication end information specifying, as at least one communication end position, at least one of the plurality of voltage detection circuits; and
  a communication control circuit which controls transfer for sending a communication command received from a preceding voltage detection circuit, among the plurality of voltage detection circuits, located at a preceding stage to a next voltage detection circuit, among the plurality of voltage detection circuits, located at a next stage, according to the communication end information.

2. The voltage measurement device according to claim 1, wherein the communication control circuit:
   allows the transfer of the communication command, when the communication end information does not specify the voltage detection circuit which includes the communication control circuit; and
   prohibits the transfer of the communication command, when the communication end information specifies the voltage detection circuit which includes the communication control circuit.

3. The voltage measurement device according to claim 1, wherein the plurality of voltage detection circuits are connected in a daisy chain to enable communication bi-directionally in a first direction and a second direction which are opposite to each other, and
   the communication control circuit controls whether to allow or prohibit each of the transfer of the communication command in the first direction and the transfer of the communication command in the second direction, according to the communication end information.

4. The voltage measurement device according to claim 3, wherein the communication end information includes:
   upper communication end information specifying a first communication end position which is included in the at least one communication end position; and a lower communication end information specifying a second communication end position which is included in the at least one communication end position, and
   the communication control circuit controls whether to allow or prohibit the transfer of the communication command that flows in the first direction according to the upper communication end information, and controls whether to allow or prohibit the transfer of the communication command that flows in the second direction according to the lower communication end information.

5. The voltage measurement device according to claim 4, wherein the first direction is a direction in which the communication command flows from the uppermost stage to the lowermost stage when it is assumed that a voltage detection circuit corresponding to a last cell in a negative side among the plurality of cells is located at the lowermost stage and that a voltage detection circuit corresponding to a last cell in a positive side among the plurality of cells is located at the uppermost stage.

6. The voltage measurement device according to claim 4, wherein the first direction is a direction in which the communication command flows from the lowermost stage to the uppermost stage when it is assumed that a voltage detection circuit corresponding to a last cell in a negative side among the plurality of cells is located at the lowermost stage and that a voltage detection circuit corresponding to a last cell in a positive side among the plurality of cells is located at the uppermost stage.

7. The voltage measurement device according to claim 4, wherein the communication control circuit selectively switches the following modes:
   (1) a first operation mode for controlling whether to allow or prohibit the transfer of the communication command that flows in the first direction according to the upper communication end information and controlling whether to allow or prohibit the transfer of the communication command that flows in the second direction according to the lower communication end information; and
   (2) a second operation mode for controlling whether to allow or prohibit the transfer of the communication command that flows in the first direction according to the lower communication end information and controlling whether to allow or prohibit the transfer of the communication command that flows in the second direction according to the upper communication end information.

8. The voltage measurement device according to claim 1, wherein the communication control circuit controls sending of a reply to the preceding voltage detection circuit when the communication command is received from the preceding voltage detection circuit.

9. The voltage measurement device according to claim 8, further comprising:
   a controller which is connected to a lowermost voltage detection circuit and an uppermost voltage detection circuit among the plurality of voltage detection circuits, sends the communication command, and receives the reply, the lower most voltage detection circuit being located at a lowermost stage, the uppermost voltage detection circuit being located at an uppermost stage.

10. The voltage measurement device according to claim 8, wherein, when the communication command received from the preceding voltage detection circuit is a broadcast communication command, the communication control circuit performs, according to the communication end information, control whether to allow or prohibit sending of a reply to the broadcast communication command to the preceding voltage detection circuit.

11. The voltage measurement device according to claim 10,
    wherein the communication control circuit:
       prohibits the sending of the reply to the broadcast communication command when the communication end information does not specify the voltage detection circuit which includes the communication control circuit; and
       allows sending of the reply to the broadcast communication command when the communication end information specifies the voltage detection circuit which includes the communication control circuit.

12. The voltage measurement device according to claim 8, wherein the communication control circuit performs control to cause a dummy reply to be sent to the next voltage detection circuit when the voltage detection circuit which includes the communication control circuit is a target of the communication command received from the preceding voltage detection circuit.

13. The voltage measurement device according to claim 12,
    wherein, when receiving the dummy reply from the preceding voltage detection circuit, the communication control circuit:
       prohibits sending of the dummy reply to the next voltage detection circuit when the communication end information specifies the voltage detection circuit which includes the communication control device; and
       allows sending of the dummy reply to the next voltage detection circuit when the communication end information does not specify the voltage detection circuit which includes the communication control device.

14. The voltage measurement device according to claim 8, wherein, when the voltage detection circuit which includes the communication control device is located after the voltage detection circuit which is a target of the communication command received from the preceding voltage detection circuit, the communication control circuit performs control to cause a dummy reply to be sent to either the preceding voltage detection circuit or the next voltage detection circuit.

15. The voltage measurement device according to claim 1, further comprising:
a battery pack having the plurality of cells connected in series.

16. A voltage detection circuit included in a plurality of voltage detection circuits included in a voltage measurement device which measures cell voltages of a plurality of cells connected in series, the voltage detection circuit comprising:
a communication end information holding circuit which holds communication end information specifying, as at least one communication end position, at least one of the plurality of voltage detection circuits; and
a communication control circuit which controls transfer for sending a communication command received from a preceding voltage detection circuit, among the plurality of voltage detection circuits, located at a preceding stage to a next voltage detection circuit, among the plurality of voltage detection circuits, located at a next stage, according to the communication end information.

17. A voltage detection method performed in a plurality of voltage detection circuits included in a voltage measurement device which measures cell voltages of a plurality of cells connected in series,
wherein each of the plurality of voltage detection circuits:
obtains a cell voltage from at least one of the plurality of cells, as battery information; and
controls transfer for sending a communication command received from a preceding voltage detection circuit, among the plurality of voltage detection circuits, located at a preceding stage to a next voltage detection circuit, among the plurality of voltage detection circuits, located at a next stage, according to communication end information specifying, as at least one communication end position, at least one of the plurality of voltage detection circuits.

\* \* \* \* \*